(12) United States Patent
Nakamura et al.

(10) Patent No.: US 8,029,972 B2
(45) Date of Patent: Oct. 4, 2011

(54) RESIST COMPOSITION AND METHOD OF FORMING RESIST PATTERN

(75) Inventors: Tsuyoshi Nakamura, Kawasaki (JP); Hiroaki Shimizu, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 178 days.

(21) Appl. No.: 12/247,807

(22) Filed: Oct. 8, 2008

(65) Prior Publication Data

US 2009/0098484 A1    Apr. 16, 2009

(30) Foreign Application Priority Data

Oct. 11, 2007 (JP) .................. 2007-265602
Dec. 10, 2007 (JP) .................. 2007-318942

(51) Int. Cl.
*G03F 7/00* (2006.01)
*G03F 7/004* (2006.01)

(52) U.S. Cl. ............ 430/270.1; 430/913; 430/919

(58) Field of Classification Search ......... 430/270.1, 430/913, 919
See application file for complete search history.

(56) References Cited

U.S. PATENT DOCUMENTS

| | | | |
|---|---|---|---|
| 5,916,728 A * | 6/1999 | Fukui et al. | 430/170 |
| 5,945,517 A * | 8/1999 | Nitta et al. | 534/558 |
| 6,153,733 A * | 11/2000 | Yukawa et al. | 534/561 |
| 6,218,069 B1 * | 4/2001 | Kato et al. | 430/190 |
| 6,927,009 B2 * | 8/2005 | Kodama et al. | 430/270.1 |
| 7,323,287 B2 * | 1/2008 | Iwai et al. | 430/270.1 |
| 7,527,909 B2 * | 5/2009 | Hirayama et al. | 430/270.1 |
| 7,604,920 B2 * | 10/2009 | Shiono et al. | 430/270.1 |
| 2005/0037291 A1 * | 2/2005 | Nitta et al. | 430/330 |
| 2007/0141508 A1 * | 6/2007 | Kaneko et al. | 430/270.1 |
| 2008/0096134 A1 * | 4/2008 | Sugimoto et al. | 430/287.1 |

FOREIGN PATENT DOCUMENTS

| | | |
|---|---|---|
| EP | 1500977 A1 * | 1/2005 |
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2002193900 A * | 7/2002 |
| JP | 2003-241385 | 8/2003 |
| JP | 2003233188 A * | 8/2003 |
| JP | 2008031220 A * | 2/2008 |
| JP | 2008058538 A * | 3/2008 |
| WO | WO 2004-074242 | 9/2004 |

* cited by examiner

*Primary Examiner* — Amanda C. Walke
(74) *Attorney, Agent, or Firm* — Knobbe Martens Olson & Bear LLP

(57) ABSTRACT

A resist composition including a base component (A) which exhibits changed solubility in an alkali developing solution under action of acid, an acid-generator component (B) which generates acid upon exposure, and a nitrogen-containing organic compound (D1) having a molecular weight of 200 or more, which is represented by general formula (d1) shown below (wherein each of $R^1$ to $R^3$ independently represents a hydrocarbon group which may have a substituent, with the proviso that at least one of $R^1$ to $R^3$ is a polar group-containing hydrocarbon group, at least one of $R^1$ to $R^3$ is a hydrophobic group, and two of $R^1$ to $R^3$ may be bonded to each other to form a ring with the nitrogen atom).

[Chemical Formula 1]

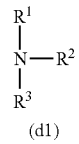

(d1)

7 Claims, No Drawings

RESIST COMPOSITION AND METHOD OF FORMING RESIST PATTERN

TECHNICAL FIELD

The present invention relates to a resist composition, and a method of forming a resist pattern using the resist composition.

Priority is claimed on Japanese Patent Application No. 2007-265602, filed Oct. 11, 2007, and Japanese Patent Application No. 2007-318942, filed Dec. 10, 2007, the contents of which are incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are now starting to be introduced in mass production. Furthermore, research is also being conducted into lithography techniques that use exposure light source having a wavelength shorter than these excimer lasers, such as $F_2$ excimer lasers, electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources. As a resist material which satisfies these conditions, a chemically amplified resist composition is used, which includes a base component that exhibits a changed solubility in an alkali developing solution under action of acid and an acid generator that generates acid upon exposure.

For example, a chemically amplified positive resist contains, as a base component (base resin), a resin which exhibits increased solubility in an alkali developing solution under action of acid, and an acid generator is typically used. With respect to a resist film formed by using such a resist composition, when acid is generated from the acid generator at exposed portions, the solubility of the resin component in an alkali developing solution is increased by the action of acid. As a result, the exposed portions become soluble in an alkali developing solution.

Currently, resins that contain structural units derived from (meth)acrylate esters within the main chain (acrylic resins) are now widely used as base resins for resists that use ArF excimer laser lithography, as they exhibit excellent transparency in the vicinity of 193 nm (see, for example, Patent Document 1).

Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

[Patent Document 1] Japanese Unexamined Patent Application, First Publication No. 2003-241385

DISCLOSURE OF INVENTION

Problems to be Solved by the Invention

In recent years, as the miniaturization of resist patterns progress, not only high resolutions, but also improvement in various lithography properties has been demanded. For example, in the formation of a resist pattern having a hole pattern, formation of a resist pattern having holes with excellent circularity and excellent shape has been more strongly demanded.

The present invention takes the above circumstances into consideration, with an object of providing a resist composition capable of forming a resist pattern having an excellent shape, and a method of forming a resist pattern using the resist composition.

Means to Solve the Problems

For solving the above-mentioned problems, the present invention employs the following aspects.

Specifically, a first aspect of the present invention is a resist composition including a base component (A) which exhibits changed solubility in an alkali developing solution under action of acid, an acid-generator component (B) which generates acid upon exposure, and a nitrogen-containing organic compound (D1) having a molecular weight of 200 or more, which is represented by general formula (d1) shown below.

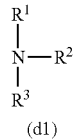

[Chemical Formula 1]

(d1)

wherein each of $R^1$ to $R^3$ independently represents a hydrocarbon group which may have a substituent, with the proviso that at least one of $R^1$ to $R^3$ is a polar group-containing hydrocarbon group, at least one of $R^1$ to $R^3$ is a hydrophobic group, and two of $R^1$ to $R^3$ may be bonded to each other to form a ring with the nitrogen atom.

A second aspect of the present invention is a method of forming a resist pattern, including: applying a resist composition of the above-mentioned first aspect of the present invention to a substrate to form a resist film on the substrate; conducting exposure of the resist film; and alkali-developing the resist film to form a resist pattern.

In the present description and claims, an "alkyl group" includes linear, branched or cyclic, monovalent saturated hydrocarbon, unless otherwise specified.

An "alkylene group" includes linear, branched or cyclic divalent saturated hydrocarbon, unless otherwise specified.

A "lower alkyl group" is an alkyl group of 1 to 5 carbon atoms.

A "halogenated alkyl group" is a group in which a part or all of the hydrogen atoms of an alkyl group is substituted with halogen atoms. Examples of halogen atoms include fluorine atoms, chlorine atoms, bromine atoms and iodine atoms.

The term "aliphatic" is a relative concept used in relation to the term "aromatic", and defines a group or compound that has no aromaticity.

The term "structural unit" refers to a monomer unit that contributes to the formation of a polymeric compound (polymer, copolymer).

The term "exposure" is used as a general concept that includes irradiation with any form of radiation.

Effect of the Invention

According to the present invention, there are provided a resist composition capable of forming a resist pattern having an excellent shape, and a method of forming a resist pattern using the resist composition.

BEST MODE FOR CARRYING OUT THE INVENTION

<<Resist Composition>>

The resist composition according to the first aspect of the present invention includes a base component (A) which exhibits changed solubility in an alkali developing solution under action of acid, an acid-generator component (B) which generates acid upon exposure, and a nitrogen-containing organic compound (D1) having a molecular weight of 200 or more, which is represented by general formula (d1) shown above.

With respect to a resist film formed using the resist composition, when a selective exposure is conducted during formation of a resist pattern, acid is generated from the component (B), and the generated acid acts on the component (A) to change the solubility of the component (A) in an alkali developing solution. As a result, the solubility of the exposed portions in an alkali developing solution is changed, whereas the solubility of the unexposed portions in an alkali developing solution remains unchanged. Therefore, the exposed portions are dissolved and removed by alkali developing in the case of a positive resist composition, whereas unexposed portions are dissolved and removed in the case of a negative resist composition, and hence, a resist pattern can be formed.

The resist composition of the present invention may be either a negative resist composition or a positive resist composition.

<Component (A)>

As the component (A), an organic compound typically used as a base component for a chemically amplified resist composition can be used alone, or two or more of such organic compounds can be mixed together.

Here, the term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The organic compounds having a molecular weight of 500 or more are broadly classified into low molecular weight organic compounds having a molecular weight of 500 to less than 2,000 (hereafter, frequently referred to as "low molecular weight compounds") and high molecular weight resins (polymeric materials) having a molecular weight of 2,000 or more. Generally, as the aforementioned low molecular weight compound, a non-polymer is used. With respect to the aforementioned resin (polymer or copolymer), the molecular weight is the polystyrene equivalent value determined by gel permeation chromatography (GPC). Hereafter, a "resin" refers to a resin having a molecular weight of 2,000 or more.

As the component (A), a resin which exhibits changed solubility in an alkali developing solution under action of acid may be used. Alternatively, as the component (A), a low molecular weight material which exhibits changed solubility in an alkali developing solution under action of acid may be used.

When the resist composition of the present invention is a negative resist composition, for example, as the component (A), a base component that is soluble in an alkali developing solution is used, and a cross-linking agent is blended in the negative resist composition.

In the negative resist composition, when acid is generated from the component (B) upon exposure, the action of the generated acid causes cross-linking between the base component and the cross-linking agent, and the cross-linked portion becomes insoluble in an alkali developing solution. Therefore, in the formation of a resist pattern, by conducting selective exposure of a resist film formed by applying the negative resist composition onto a substrate, the exposed portions become insoluble in an alkali developing solution, whereas the unexposed portions remain soluble in an alkali developing solution, and hence, a resist pattern can be formed by alkali developing.

Generally, as the component (A) for a negative resist composition, a resin that is soluble in an alkali developing solution (hereafter, referred to as "alkali-soluble resin") is used.

As the alkali-soluble resin, it is preferable to use a resin having a structural unit derived from at least one of α-(hydroxyalkyl)acrylic acid and a lower alkyl ester of α-(hydroxyalkyl)acrylic acid, as it enables formation of a satisfactory resist pattern with minimal swelling. Here, the term "α-(hydroxyalkyl)acrylic acid" refers to one or both of acrylic acid in which a hydrogen atom is bonded to the carbon atom on the α-position having the carboxyl group bonded thereto, and α-hydroxyalkylacrylic acid in which a hydroxyalkyl group (preferably a hydroxyalkyl group of 1 to 5 carbon atoms) is bonded to the carbon atom on the α-position.

As the cross-linking agent, typically, an amino-based cross-linking agent such as a glycoluril having a methylol group or alkoxymethyl group is preferable, as it enables formation of a resist pattern with minimal swelling. The amount of the cross-linking agent added is preferably within the range from 1 to 50 parts by weight, relative to 100 parts by weight of the alkali-soluble resin.

When the resist composition of the present invention is a positive resist composition, as the component (A), a base component (A') which exhibits increased solubility in an alkali developing solution by action of acid (hereafter, referred to as "component (A')") is used. The component (A') is insoluble in an alkali developing solution prior to exposure, and when acid is generated from the component (B) upon exposure, the solubility of the component (A') in an alkali developing solution increases. Therefore, in the formation of a resist pattern, by conducting selective exposure of a resist film formed by applying the positive resist composition onto a substrate, the exposed portions changes from an insoluble state to a soluble slate in an alkali developing solution, whereas the unexposed portions remain insoluble in an alkali developing solution, and hence, a resist pattern can be formed by alkali developing.

In the resist composition of the present invention, the component (A) is preferably a base component (A') which exhibits increased solubility in an alkali developing solution under action of acid. That is, the resist composition of the present invention is preferably a positive resist composition.

The component (A') may be a resin component (A1) which exhibits increased solubility in an alkali developing solution under action of acid (hereafter, referred to as "component (A1)"), a low molecular weight compound (A2) which exhibits increased solubility in an alkali developing solution under action of acid (hereafter, referred to as "component (A2)"), or a mixture of the component (A1) and the component (A2).

[Component (A1)]

As the component (A1), a resin component (base resin) typically used as a base component for a chemically amplified resist composition can be used alone, or two or more of such resin components can be mixed together.

In the present invention, it is preferable that the component (A1) include a structural unit derived from an acrylate ester.

In the present descriptions and the claims, the term "structural unit derived from an acrylate ester" refers to a structural unit which is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. As the substituent, a lower alkyl group or a halogenated lower alkyl group can be mentioned.

With respect to the "structural unit derived from an acrylate ester", the "α-position (the carbon atom on the α-position)" refers to the carbon atom having the carbonyl group bonded thereto, unless specified otherwise.

With respect to the acrylate ester, specific examples of the lower alkyl group for the substituent at the α-position include linear or branched alkyl groups such as a methyl group, ethyl group, propyl group, isopropyl group, n-butyl group, isobutyl group, tert-butyl group, pentyl group, isopentyl group, and neopentyl group.

Specific examples of the halogenated lower alkyl group include groups in which some or all of the hydrogen atoms of the aforementioned "lower alkyl group for the substituent at the α-position" are substituted with halogen atoms. Examples of halogen atoms include fluorine atoms, chlorine atoms, bromine atoms and iodine atoms, and fluorine atoms are particularly desirable.

In the present invention, it is preferable that a hydrogen atom, a lower alkyl group or a halogenated lower alkyl group is bonded to the α-position of the acrylate ester, more preferably a hydrogen atom, a lower alkyl group or a fluorinated lower alkyl group. In terms of industrial availability, a hydrogen atom or a methyl group is particularly desirable.

It is particularly desirable that the component (A1) have a structural unit (a1) derived from an acrylate ester containing an acid dissociable, dissolution inhibiting group.

Further, it is preferable that the component (A1) have a structural unit (a2) derived from an acrylate ester containing a lactone-containing cyclic group, as well as the structural unit (a1).

Furthermore, it is preferable that the component (A1) have a structural unit (a3) derived from an acrylate ester containing a polar group-containing aliphatic hydrocarbon group, as well as the structural unit (a1), or the structural unit (a1) and the structural unit (a2).

Structural Unit (a1)

As the acid dissociable, dissolution inhibiting group in the structural unit (a1), any of the groups that have been proposed as acid dissociable, dissolution inhibiting groups for the base resins of chemically amplified resists can be used, provided the group has an alkali dissolution-inhibiting effect that renders the entire component (A1) insoluble in an alkali developing solution prior to dissociation, and then following dissociation by action of acid, increases the solubility of the entire component (A1) in the alkali developing solution.

Generally, groups that form either a cyclic or chain-like tertiary alkyl ester with the carboxyl group of the (meth) acrylic acid, and acetal-type acid dissociable, dissolution inhibiting groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

The term "aliphatic branched" refers to a branched structure having no aromaticity.

The "aliphatic branched, acid dissociable, dissolution inhibiting group" is not limited to be constituted of only carbon atoms and hydrogen atoms (not limited to hydrocarbon groups), but is preferably a hydrocarbon group.

Further, the "hydrocarbon group" may be either saturated or unsaturated, but is preferably saturated.

Examples of aliphatic branched, acid dissociable, dissolution inhibiting groups include tertiary alkyl groups of 4 to 8 carbon atoms, and specific examples include a tert-butyl group, tert-pentyl group and tert-heptyl group.

The term "aliphatic cyclic group" refers to a monocyclic group or polycyclic group that has no aromaticity.

The "aliphatic cyclic group" within the structural unit (a1) may or may not have a substituent. Examples of substituents include lower alkyl groups of 1 to 5 carbon atoms, fluorine atom, fluorinated lower alkyl groups of 1 to 5 carbon atoms, and oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated. Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated lower alkyl group, may be exemplified. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

As the aliphatic cyclic group-containing acid dissociable, dissolution inhibiting group, for example, a group which has a tertiary carbon atom on the ring structure of the cycloalkyl group can be mentioned. Specific examples include 2-methyl-2-adamantyl group and a 2-ethyl-2-adamantyl group. Further, groups having an aliphatic cyclic group such as an adamantyl group, cyclohexyl group, cyclopentyl group, norbornyl group, tricyclodecanyl group or tetracyclododecanyl group, and a branched alkylene group having a tertiary carbon atom bonded thereto, as the groups bonded to the oxygen atom of the carbonyl group (—C(O)—O—) within the structural units represented by general formulas (a1"-1) to (a1"-6) shown below, can be exemplified.

[Chemical Formula 2]

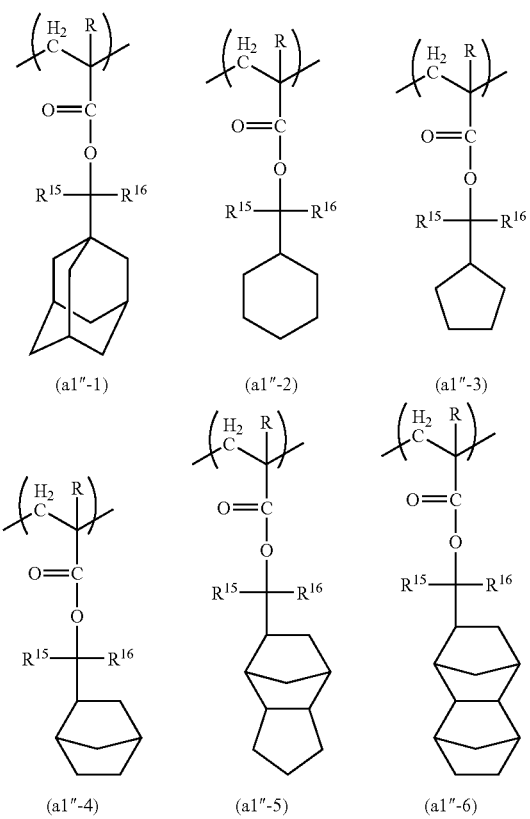

wherein R represents a hydrogen atom, a lower alkyl group or a halogenated lower alkyl group; and $R^{15}$ and $R^{16}$ each independently represents an alkyl group (which may be linear or branched, and preferably has 1 to 5 carbon atoms).

In general formulas (a1"-1) to (a1"-6) above, the lower alkyl group or halogenated lower alkyl group for R are the same as the lower alkyl group or halogenated lower alkyl group which can be bonded to the α-position of the aforementioned acrylate ester.

An "acetal-type acid dissociable, dissolution inhibiting group" generally substitutes a hydrogen atom at the terminal of an alkali-soluble group such as a carboxy group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 3]

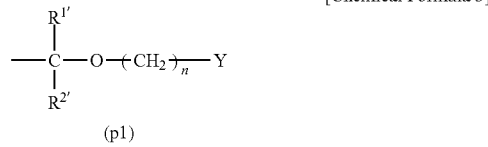

(p1)

wherein $R^{1\prime}$ and $R^{2\prime}$ each independently represents a hydrogen atom or a lower alkyl group; n represents an integer of 0 to 3; and Y represents a lower alkyl group or an aliphatic cyclic group.

In general formula (p1) above, n is preferably an integer of 0 to 2, more preferably 0 or 1, and most preferably 0.

As the lower alkyl group for $R^{1\prime}$ and $R^{2\prime}$, the same as the lower alkyl groups for R above can be exemplified. As the lower alkyl group for $R^{1\prime}$ and $R^{2\prime}$, a methyl group or ethyl group is preferable, and a methyl group is particularly desirable.

In the present invention, it is preferable that at least one of R1' and R2' be a hydrogen atom. That is, it is preferable that the acid dissociable, dissolution inhibiting group (p1) is a group represented by general formula (p1-1) shown below.

[Chemical Formula 4]

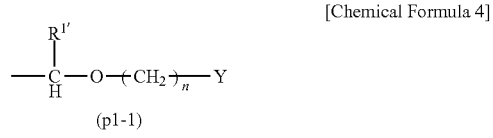

(p1-1)

wherein $R^{1\prime}$, n and Y are as defined above.

As the lower alkyl group for Y, the same as the lower alkyl groups for R above can be exemplified.

As the aliphatic cyclic group for Y, any of the aliphatic monocyclic/polycyclic groups which have been proposed for conventional ArF resists and the like can be appropriately selected for use. For example, the same groups described above in connection with the "aliphatic cyclic group" can be exemplified.

Further, as the acetal-type, acid dissociable, dissolution inhibiting group, groups represented by general formula (p2) shown below can also be exemplified.

[Chemical Formula 5]

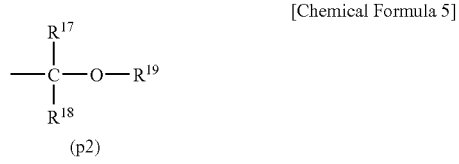

(p2)

wherein $R^{17}$ and $R^{18}$ each independently represents a linear or branched alkyl group or a hydrogen atom; and $R^{19}$ represents a linear, branched or cyclic alkyl group; or $R^{17}$ and $R^{19}$ each independently represents a linear or branched alkylene group, wherein the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be exemplified. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane. Of these, a group in which one or more hydrogen atoms have been removed from adamantane is preferable.

In general formula (p2) above, $R^{17}$ and $R^{19}$ may each independently represent a linear or branched alkylene group preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto and the carbon atom having the oxygen atom and $R^{17}$ bonded thereto. Such a cyclic group is preferably a 4 to 7-membered ring, and more preferably a 4 to 6-membered ring. Specific examples of the cyclic group include tetrahydropyranyl group and tetrahydrofuranyl group.

As the structural unit (a1), it is preferable to use at least one member selected from the group consisting of structural units represented by formula (a1-0-1) shown below and structural units represented by formula (a1-0-2) shown below.

[Chemical Formula 6]

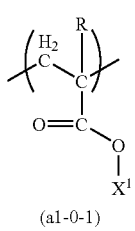

(a1-0-1)

wherein R represents a hydrogen atom, a lower alkyl group or a halogenated lower alkyl group; and $X^1$ represents an acid dissociable, dissolution inhibiting group.

[Chemical Formula 7]

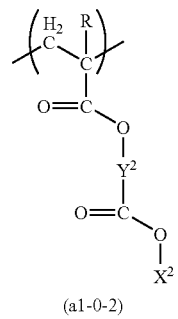

(a1-0-2)

wherein R represents a hydrogen atom, a lower alkyl group or a halogenated lower alkyl group; $X^2$ represents an acid dissociable, dissolution inhibiting group; and $Y^2$ represents an alkylene group, a divalent aliphatic cyclic group or "A-O-B" (wherein A represents a divalent hydrocarbon group of 1 or more carbon atoms which may have a substituent; and B represents a divalent hydrocarbon group of 1 or more carbon atoms which may have a substituent).

In general formula (a1-0-1) shown above, lower alkyl group and halogenated lower alkyl group for R are the same as the lower alkyl group and halogenated lower alkyl group which can be bonded to the α-position of the aforementioned acrylate ester.

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is as defined above.

$X^2$ is the same as $X^1$ in general formula (a1-0-1).

$Y^2$ represents an alkylene group, a divalent aliphatic cyclic group or the aforementioned "A-O-B".

As the aliphatic cyclic group, the same as those exemplified above in connection with the explanation of "aliphatic cyclic group" can be used, except that two hydrogen atoms have been removed therefrom.

When $Y^2$ represents an alkylene group, it preferably has 1 to 10 carbon atoms, more preferably 1 to 6, still more preferably 1 to 4, and most preferably 1 to 3.

When $Y^2$ represents a divalent aliphatic cyclic group, it is particularly desirable that the divalent aliphatic cyclic group be a group in which two or more hydrogen atoms have been removed from cyclopentane, cyclohexane, norbornane, isobornane, ademantane, tricyclodecane or tetracyclododecane.

When $Y^2$ represents "A-O-B", A represents a divalent hydrocarbon group of 1 or more carbon atoms which may have a substituent, and B represents a divalent hydrocarbon group of 1 or more carbon atoms which may have a substituent.

When a hydrocarbon "has a substituent", it means that a part or all of the hydrogen atoms within the hydrocarbon group is substituted with groups or atoms other than hydrogen atom.

The hydrocarbon group may be either an aliphatic hydrocarbon group, or an aromatic hydrocarbon group.

An "aliphatic hydrocarbon group" refers to a hydrocarbon group that has no aromaticity.

The aliphatic hydrocarbon group for A may be either saturated or unsaturated. In general, the aliphatic hydrocarbon group is preferably saturated.

As specific examples of the aliphatic hydrocarbon group for A, a linear or branched aliphatic hydrocarbon group, and an aliphatic hydrocarbon group having a ring in the structure thereof can be exemplified.

The linear or branched aliphatic hydrocarbon group preferably has 1 to 10 carbon atoms, more preferably 1 to 8, still more preferably 2 to 5, and most preferably 2.

As the linear aliphatic hydrocarbon group, a linear alkylene group is preferable, and specific examples include a methylene group, an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, a branched alkylene group is preferable, and specific examples include alkylalkylene groups, e.g., alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$; alkylethylene groups such as —$CH(CH_3)CH_2$—, —$CH(CH_3)CH(CH_3)$—, —$C(CH_3)_2CH_2$—, —$CH(CH_2CH_3)CH_2$— and —$CH(CH_2CH_3)CH_2$—; alkyltrimethylene groups such as —$CH(CH_3)CH_2CH_2$— and —$CH_2CH(CH_3)CH_2$—; and alkyltetramethylene groups such as —$CH(CH_3)CH_2CH_2CH_2$— and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of substituents include fluorine atom, fluorinated lower alkyl groups of 1 to 5 carbon atoms, and oxygen atom (=O).

As the hydrocarbon group containing a ring, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be exemplified.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of substituents include a lower alkyl group of 1 to 5 carbon atoms, a fluorine atom, a fluorinated lower alkyl group of 1 to 5 carbon atoms, and an oxygen atom (=O).

As A, a linear aliphatic hydrocarbon group is preferable, more preferably a linear alkylene group, still more preferably a linear alkylene group of 2 to 5 carbon atoms, and most preferably an ethylene group.

As the hydrocarbon group for B, the same divalent hydrocarbon groups of 2 or more carbon atoms as the hydrocarbon groups for A, and a methylene group which may have a substituent, can be exemplified. As the substituent which a methylene group may have, the same as the substituents which the aforementioned chin-like aliphatic hydrocarbon group may have can be exemplified.

As B, a linear or branched aliphatic hydrocarbon group is preferable, and a methylene group or an alkylmethylene group is particularly desirable.

The alkyl group within the alkyl methylene group is preferably a linear alkyl group of 1 to 5 carbon atoms, more preferably a linear alkyl group of 1 to 3 carbon atoms, and most preferably a methyl group.

Specific examples of the structural unit (a1) include structural units represented by general formulas (a1-1) to (a1-4) shown below.

[Chemical Formula 8]

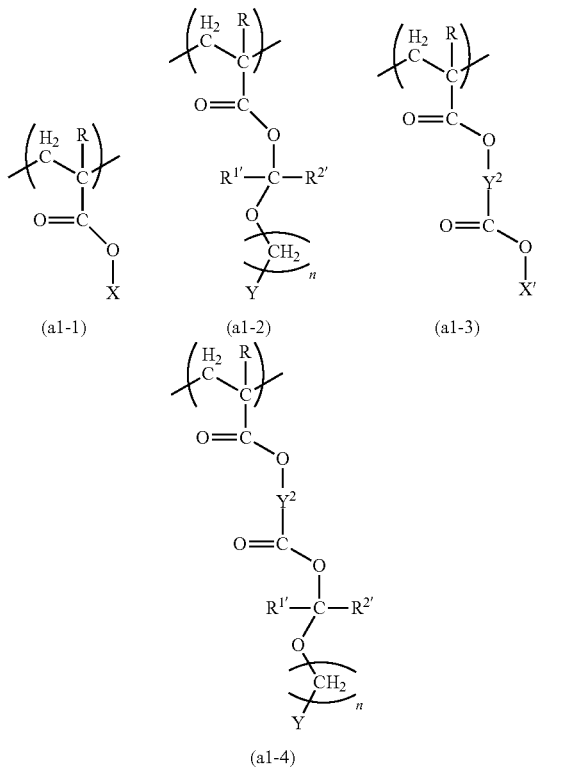

(a1-1)    (a1-2)    (a1-3)

(a1-4)

wherein X' represents a tertiary alkyl ester-type acid dissociable, dissolution inhibiting group; Y represents a lower alkyl group of 1 to 5 carbon atoms or an aliphatic cyclic group; n represents an integer of 0 to 3; $Y^2$ represents an alkylene group, a divalent aliphatic cyclic group or "A-O-B" (wherein A and B are respectively as defined above); R is as defined above; and each of $R^{1'}$ and $R^{2'}$ independently represents a hydrogen atom or a lower alkyl group of 1 to 5 carbon atoms.

Examples of the tertiary alkyl ester-type acid dissociable, dissolution inhibiting group for X' ate the same s the above-exemplified tertiary alkyl ester-type acid dissociable, dissolution inhibiting groups for $X^1$.

As $R^{1'}$, $R^{2'}$, n and Y, the same as $R^{1'}$, $R^{2'}$, n and Y defined for general formula (p1) described above in connection with the "acetal-type acid dissociable, dissolution inhibiting group" may be exemplified.

As $Y^2$, the same as $Y^2$ defined for general formula (a1-0-2) above may be exemplified.

Specific examples of structural units represented by general formula (a1-1) to (a1-4) are shown below.
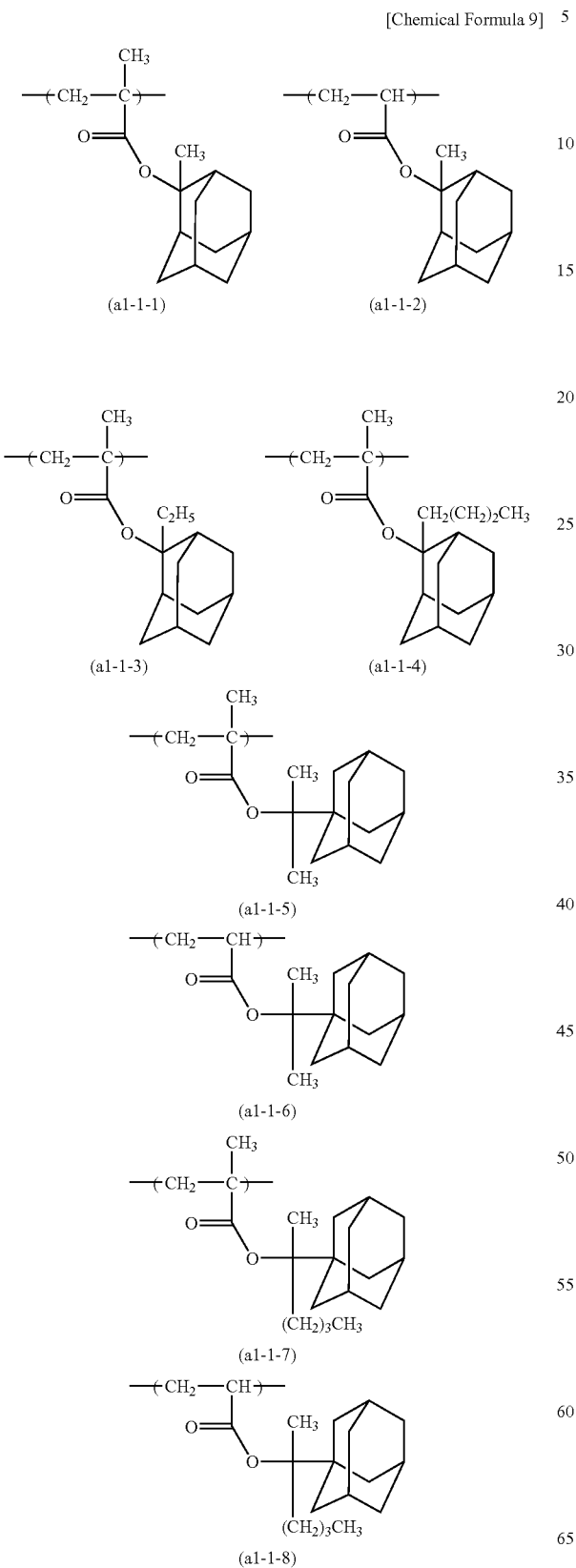
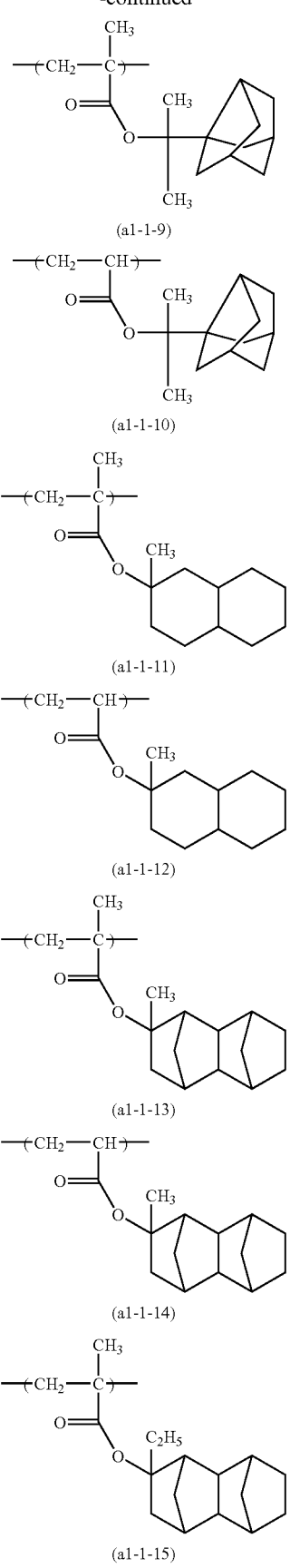

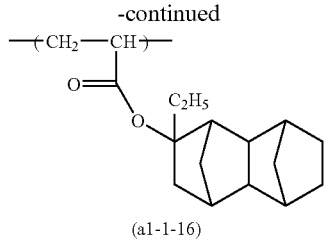
(a1-1-16)
[Chemical Formula 10]
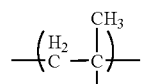 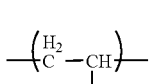
(a1-1-17)  (a1-1-18)
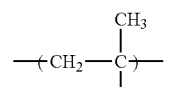
(a1-1-19)
(a1-1-20)
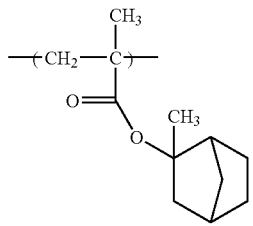 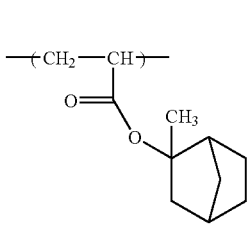
(a1-1-21)  (a1-1-22)
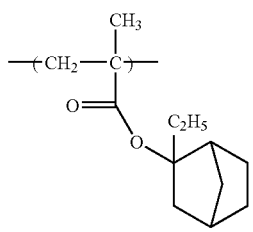 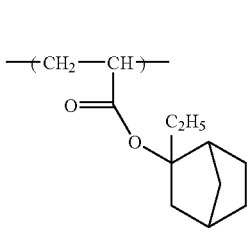
(a1-1-23)  (a1-1-24)
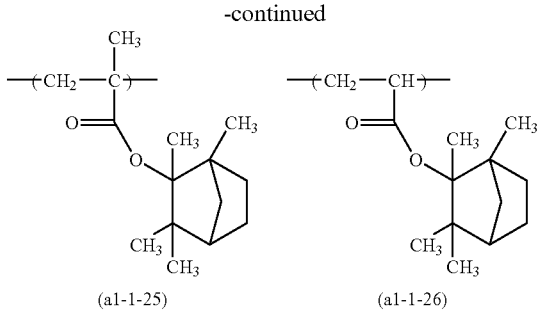
(a1-1-25)  (a1-1-26)
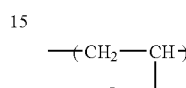 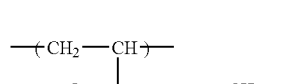
(a1-1-27)  (a1-1-28)
 
(a1-1-29)  (a1-1-30)
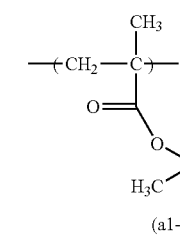 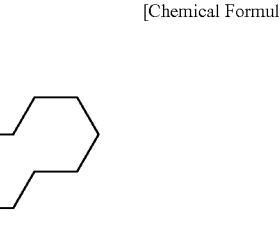
(a1-1-31)  (a1-1-32)
[Chemical Formula 11]
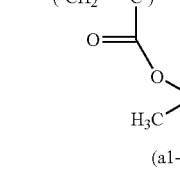
(a1-1-33)
(a1-1-34)

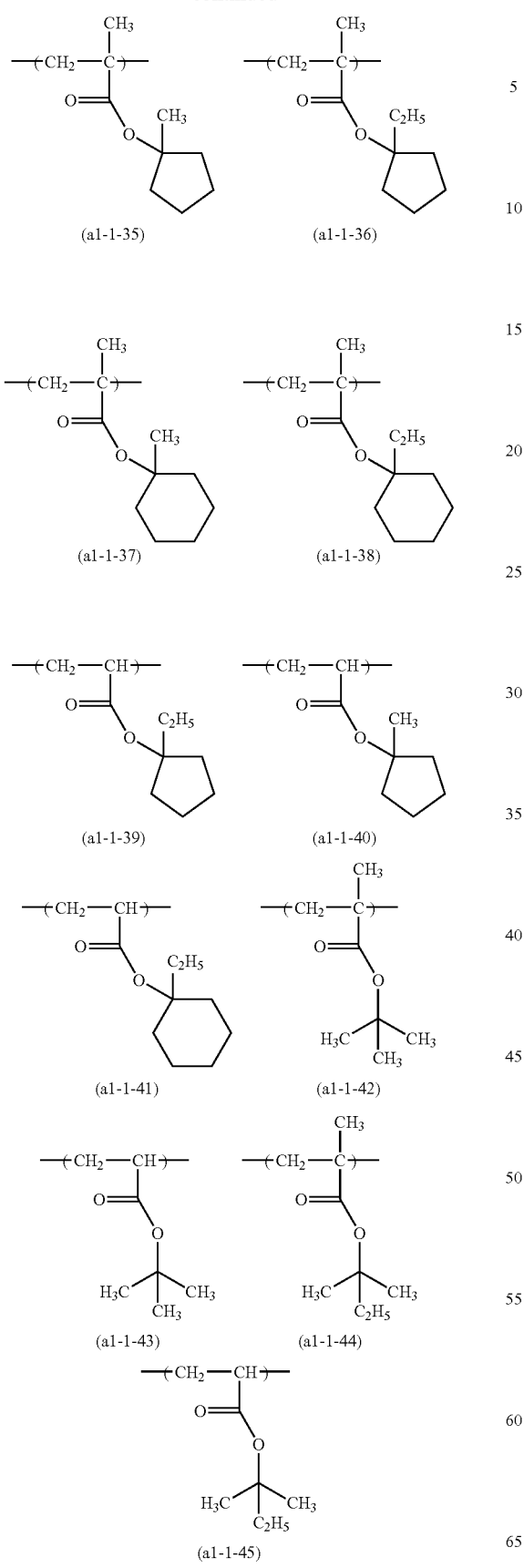
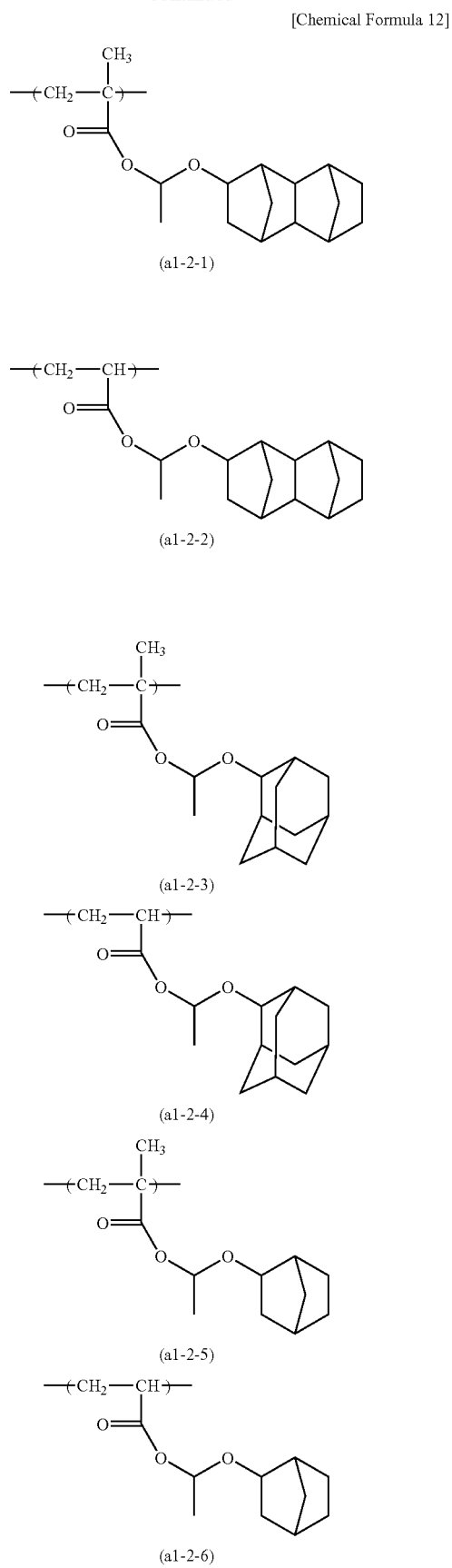

[Chemical Formula 13]
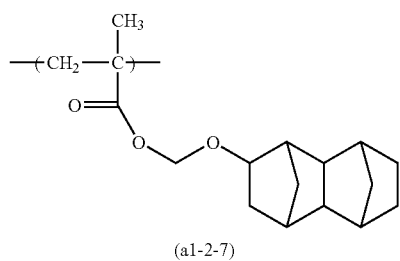
(a1-2-7)
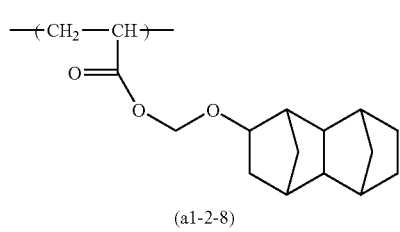
(a1-2-8)
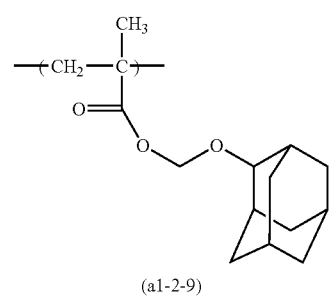
(a1-2-9)
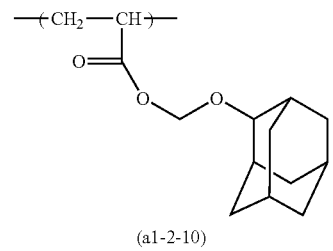
(a1-2-10)
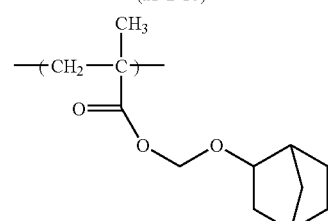
(a1-2-11)
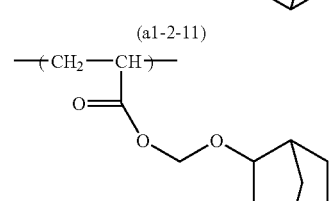
(a1-2-12)
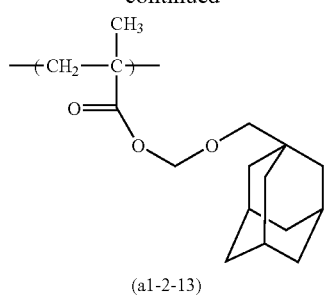
(a1-2-13)
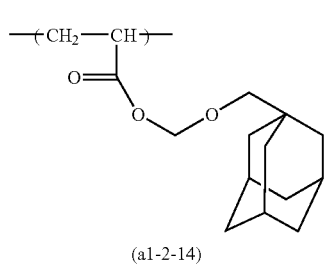
(a1-2-14)
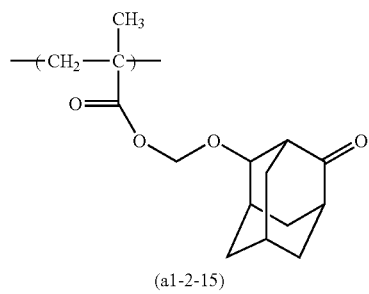
(a1-2-15)
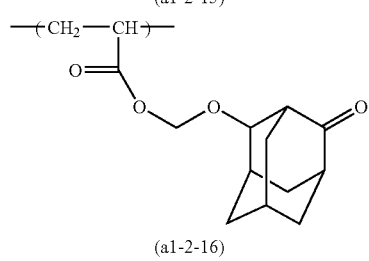
(a1-2-16)
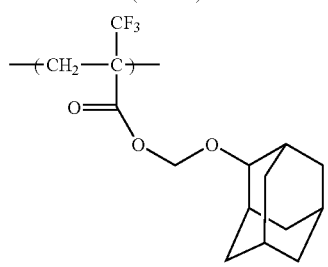
(a1-2-17)
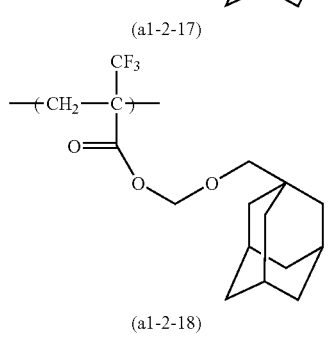
(a1-2-18)

-continued
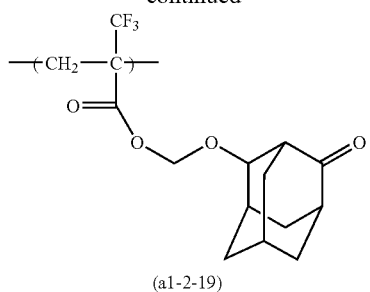
(a1-2-19)
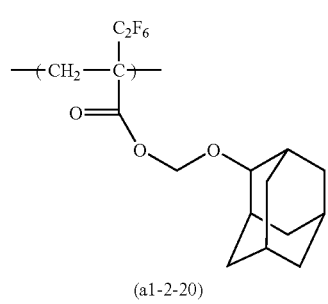
(a1-2-20)
[Chemical Formula 14]
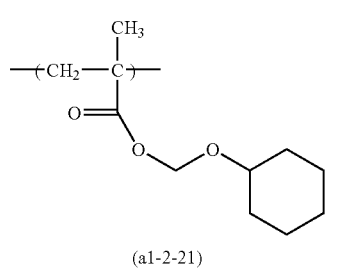
(a1-2-21)
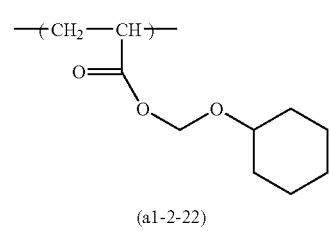
(a1-2-22)
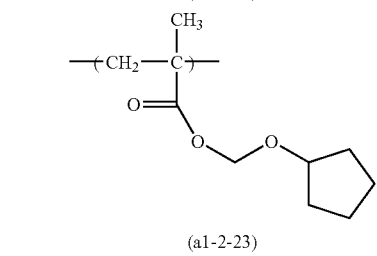
(a1-2-23)
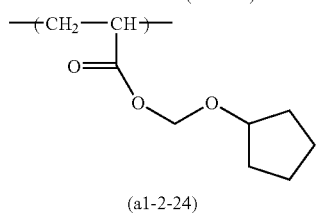
(a1-2-24)
-continued
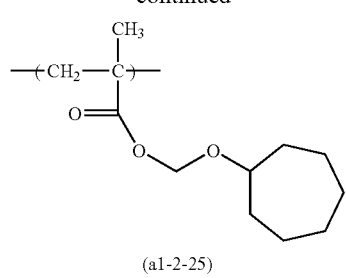
(a1-2-25)
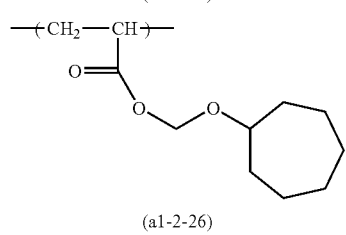
(a1-2-26)
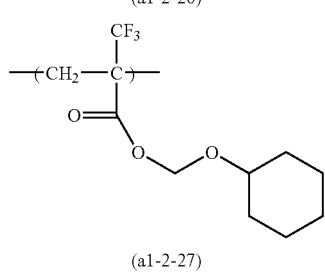
(a1-2-27)
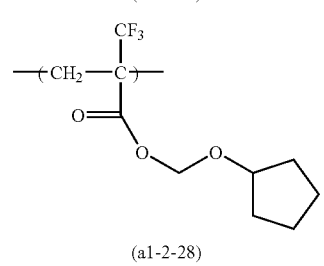
(a1-2-28)
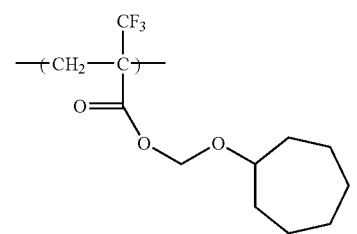
(a1-2-29)
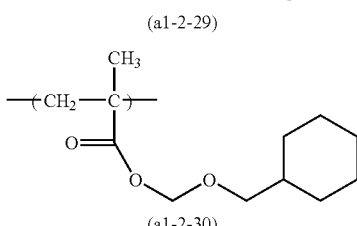
(a1-2-30)
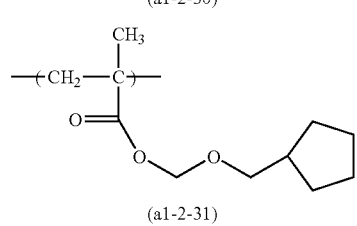
(a1-2-31)

[Chemical Formula 15]
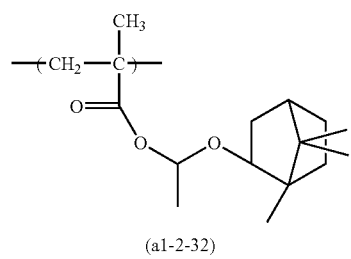
(a1-2-32)
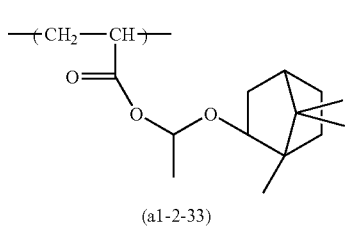
(a1-2-33)
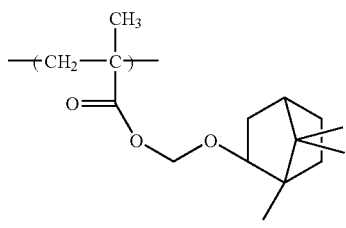
(a1-2-34)
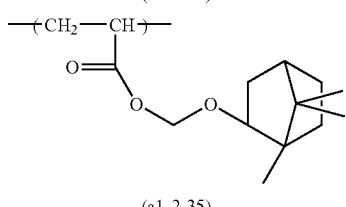
(a1-2-35)
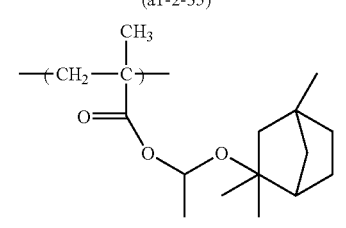
(a1-2-36)
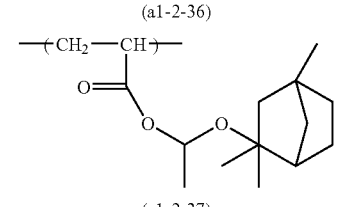
(a1-2-37)
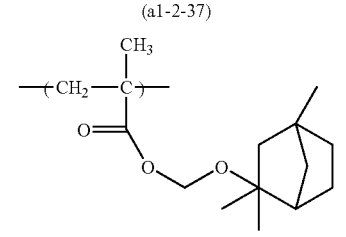
(a1-2-38)
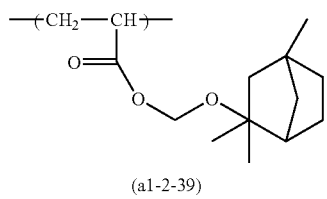
(a1-2-39)
[Chemical Formula 16]
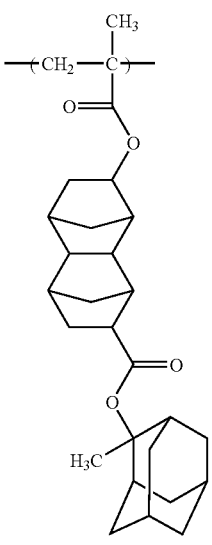
(a1-3-1)
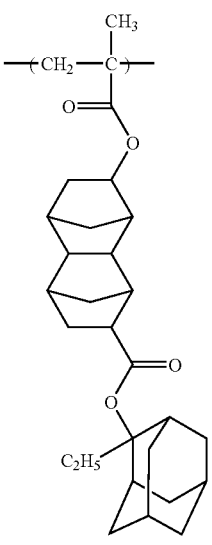
(a1-3-2)
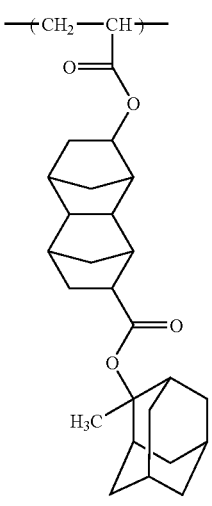
(a1-3-3)
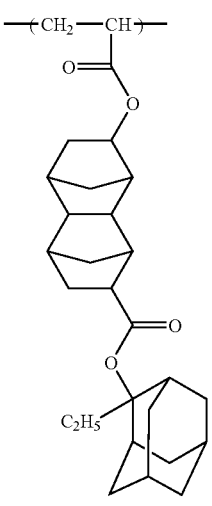
(a1-3-4)

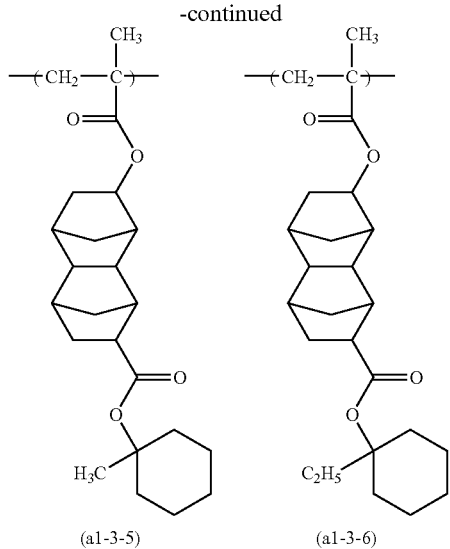
(a1-3-5)  (a1-3-6)
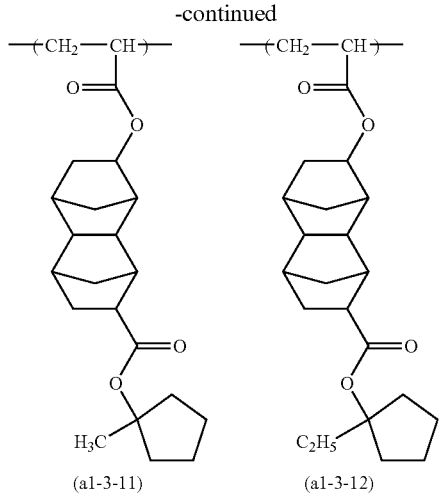
(a1-3-11)  (a1-3-12)
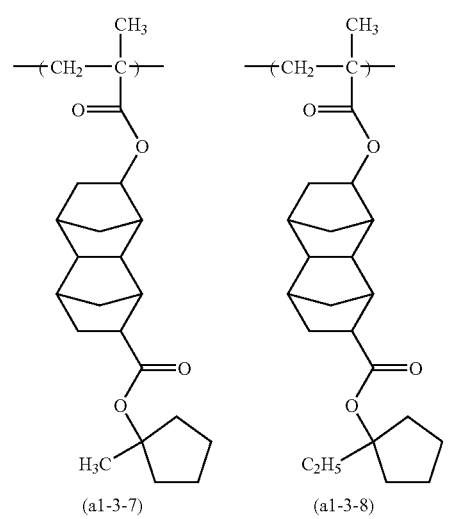
(a1-3-7)  (a1-3-8)
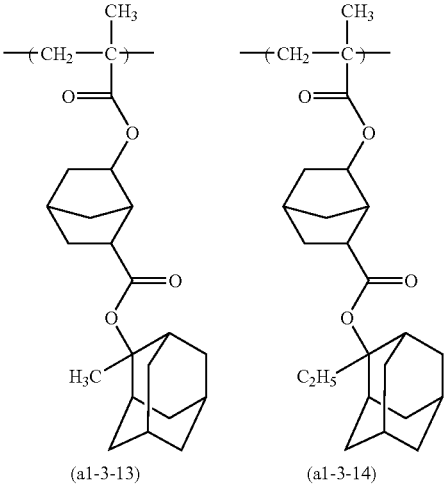
(a1-3-13)  (a1-3-14)
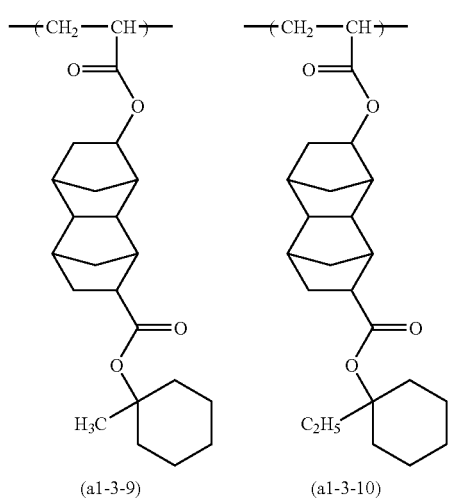
(a1-3-9)  (a1-3-10)
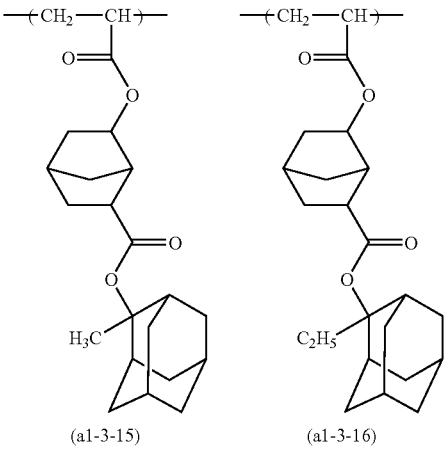
(a1-3-15)  (a1-3-16)

-continued
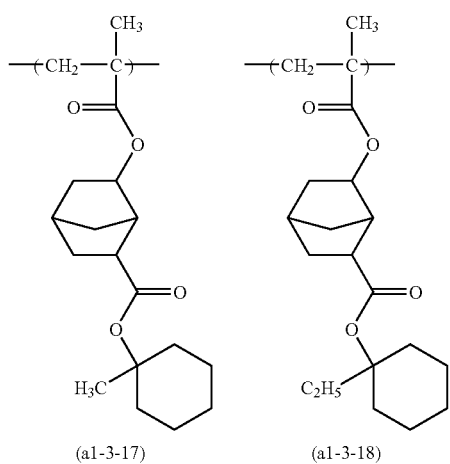
(a1-3-17)  (a1-3-18)
[Chemical Formula 17]
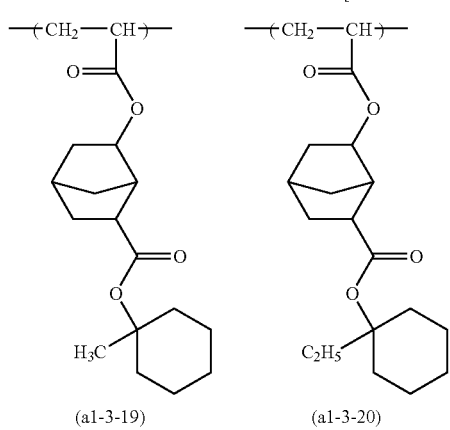
(a1-3-19)  (a1-3-20)
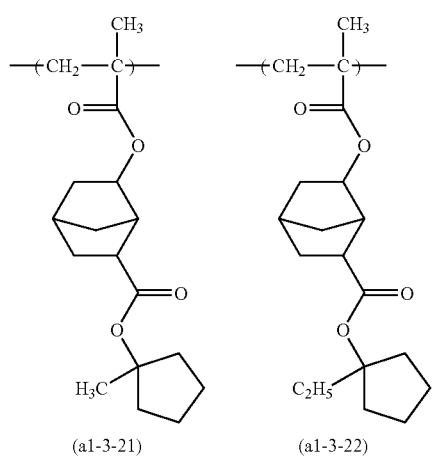
(a1-3-21)  (a1-3-22)
-continued
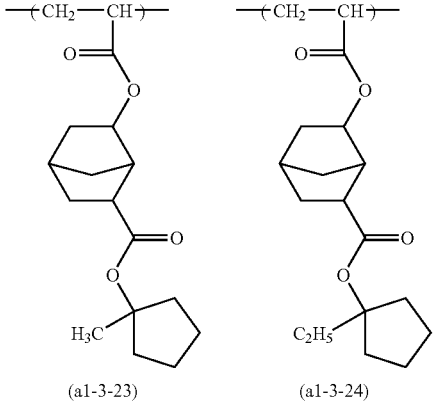
(a1-3-23)  (a1-3-24)
[Chemical Formula 18]
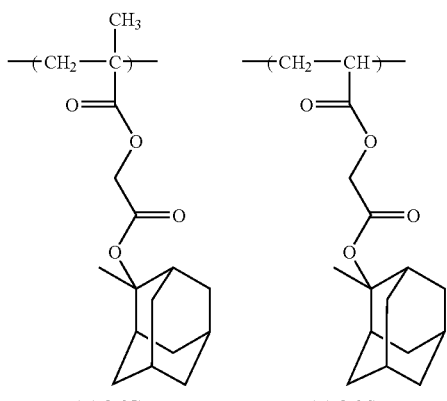
(a1-3-25)  (a1-3-26)
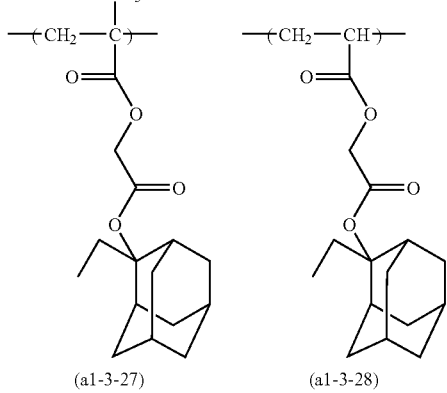
(a1-3-27)  (a1-3-28)
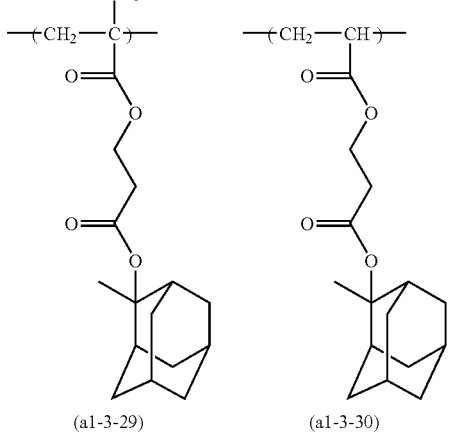
(a1-3-29)  (a1-3-30)

-continued
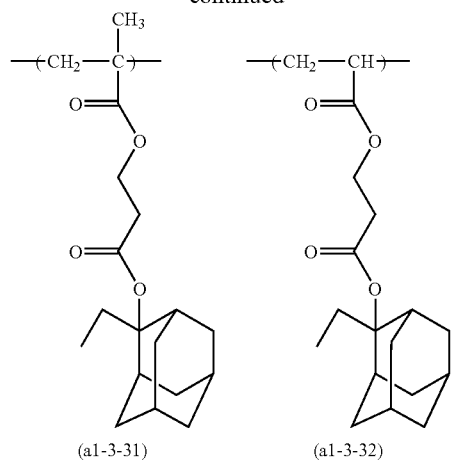
(a1-3-31)  (a1-3-32)
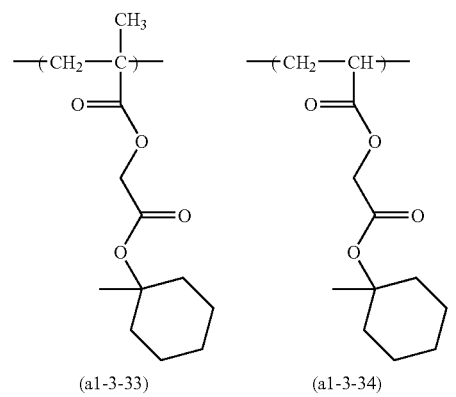
(a1-3-33)  (a1-3-34)
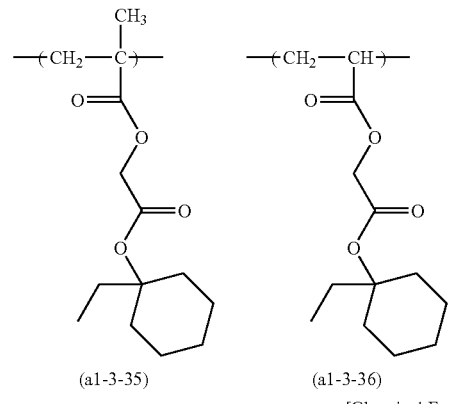
(a1-3-35)  (a1-3-36)
[Chemical Formula 19]
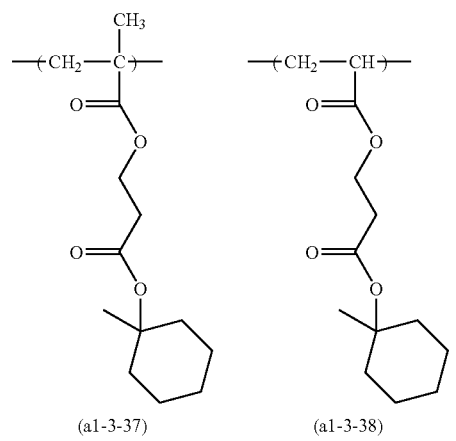
(a1-3-37)  (a1-3-38)
-continued
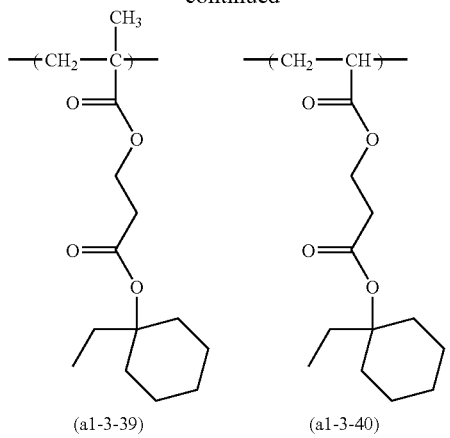
(a1-3-39)  (a1-3-40)
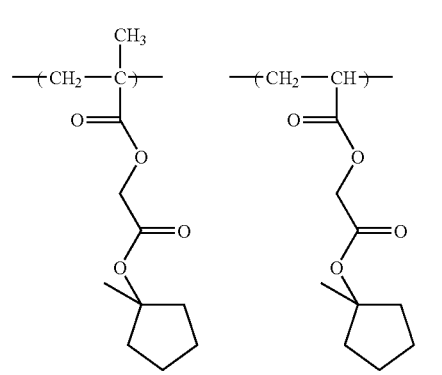
(a1-3-41)  (a1-3-42)
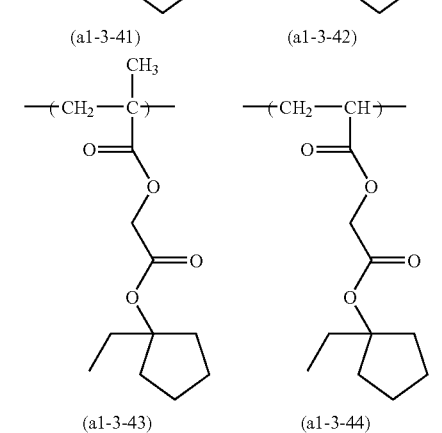
(a1-3-43)  (a1-3-44)
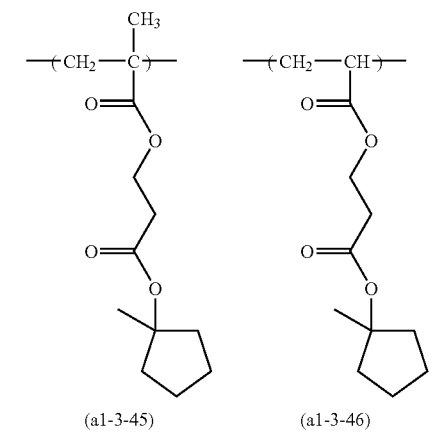
(a1-3-45)  (a1-3-46)

-continued
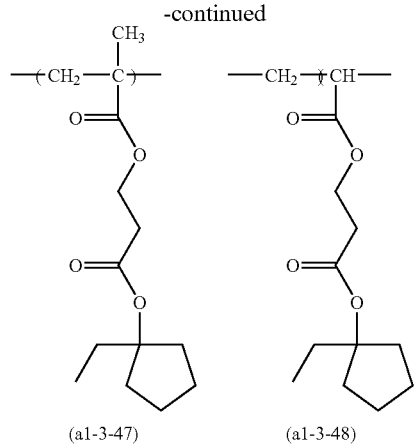
(a1-3-47)  (a1-3-48)
[Chemical Formula 20]
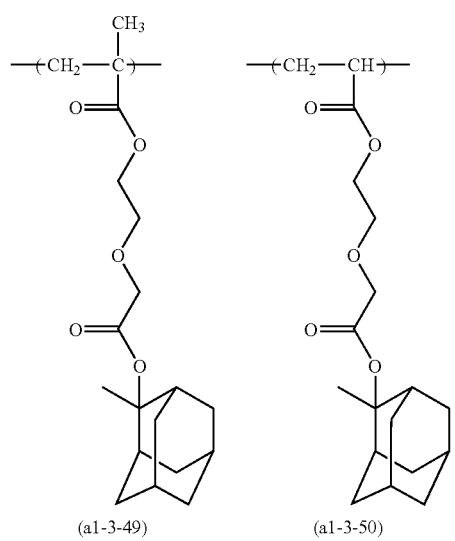
(a1-3-49)  (a1-3-50)
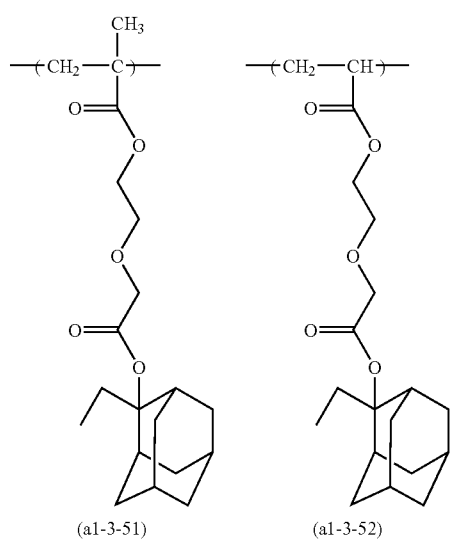
(a1-3-51)  (a1-3-52)
-continued
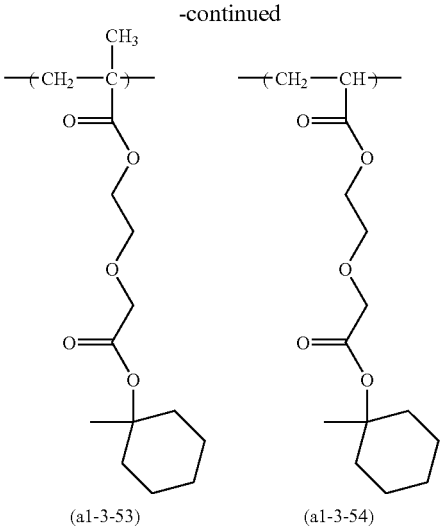
(a1-3-53)  (a1-3-54)
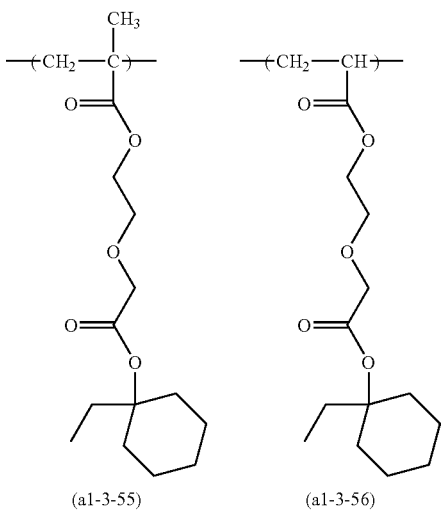
(a1-3-55)  (a1-3-56)
[Chemical Formula 21]
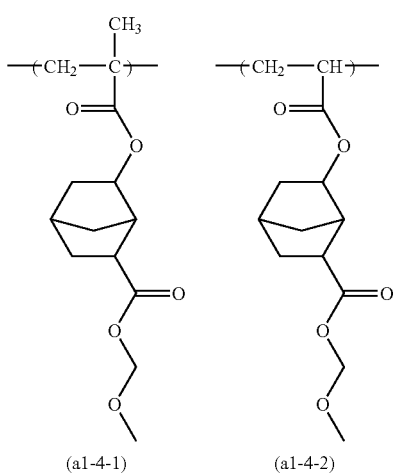
(a1-4-1)  (a1-4-2)

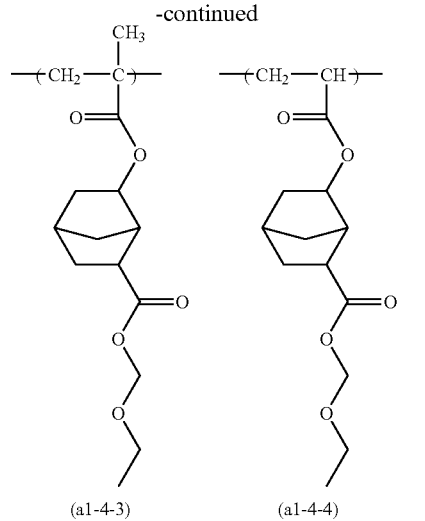
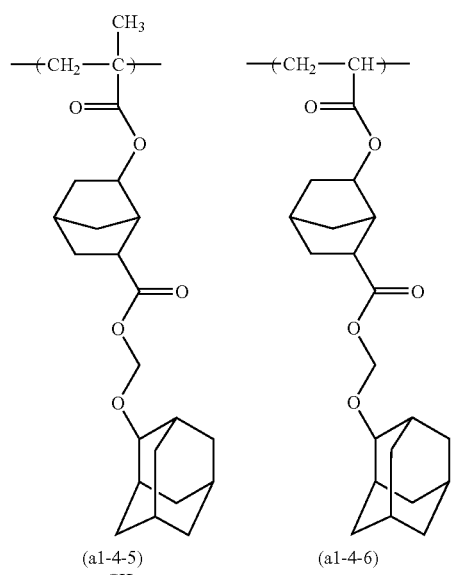
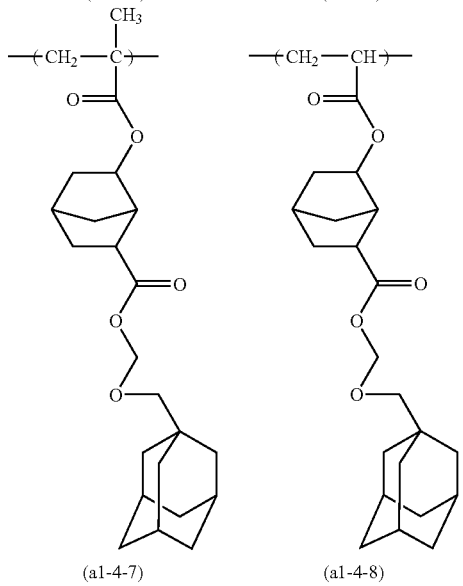
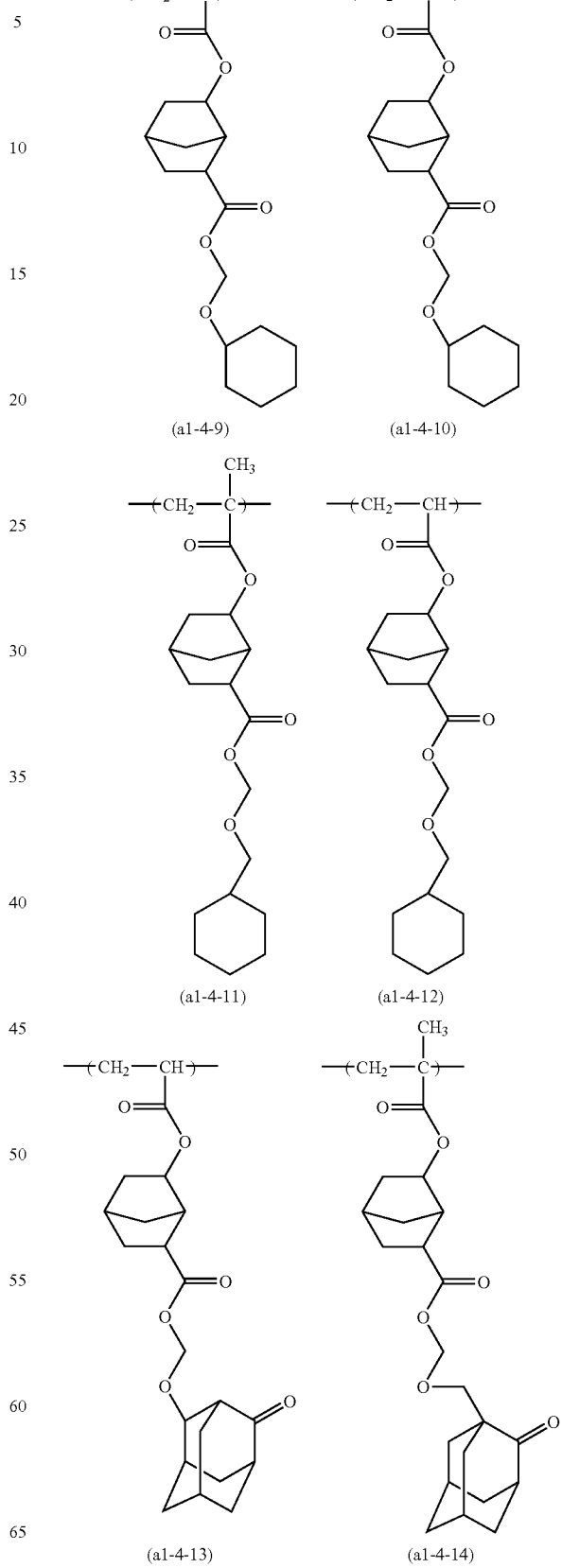

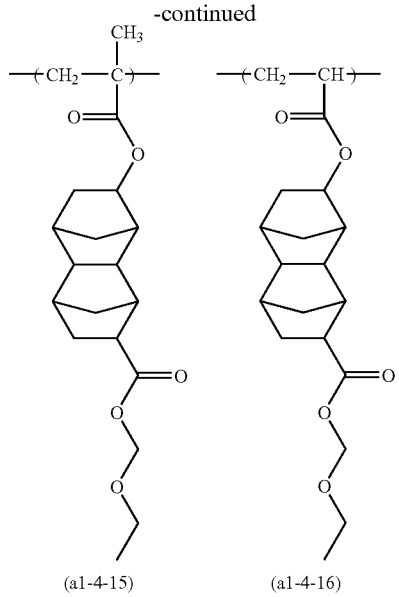
(a1-4-15) (a1-4-16)
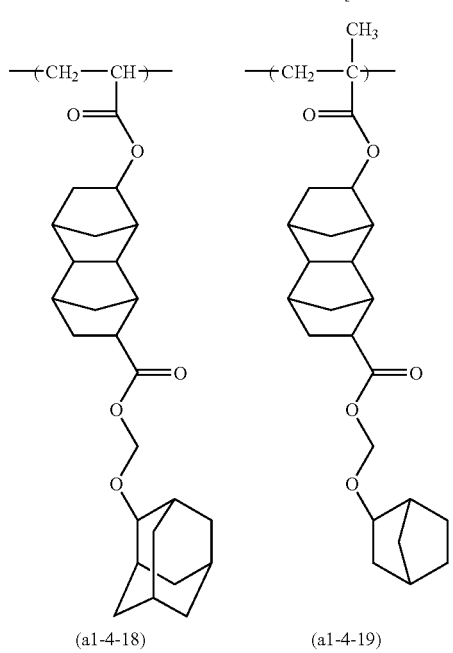
(a1-4-18) (a1-4-19)
[Chemical Formula 22]
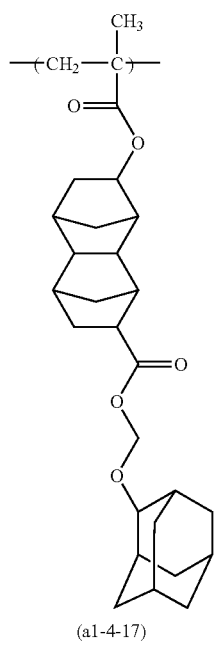
(a1-4-17)
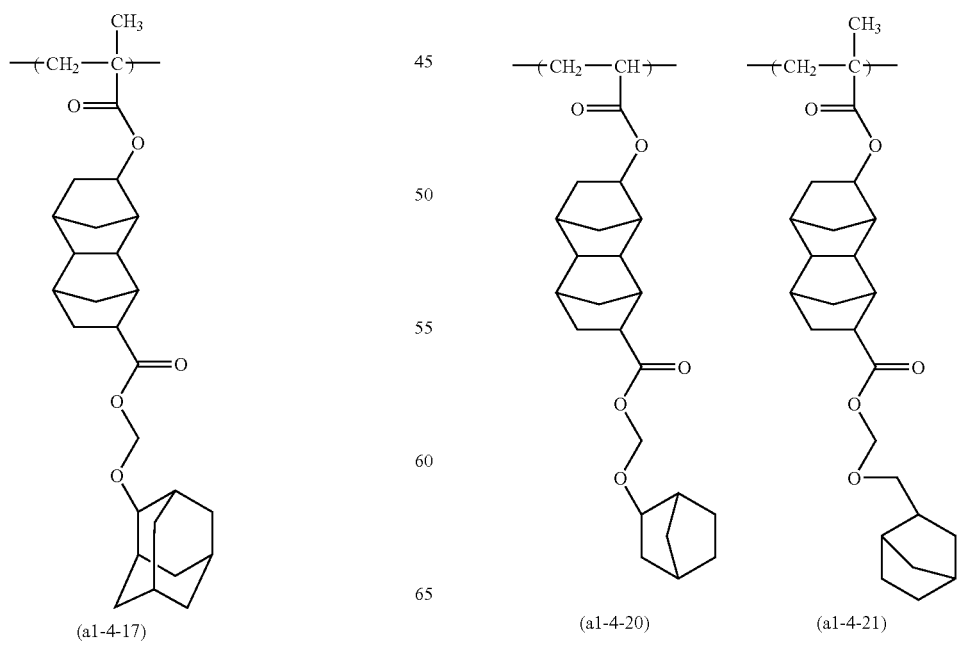
(a1-4-20) (a1-4-21)

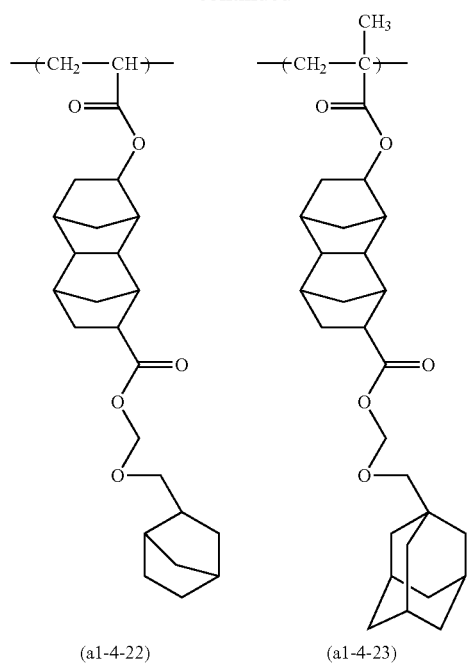
(a1-4-22) (a1-4-23)
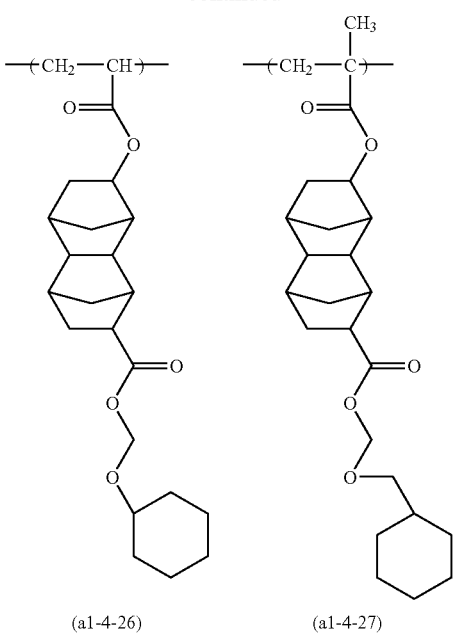
(a1-4-26) (a1-4-27)
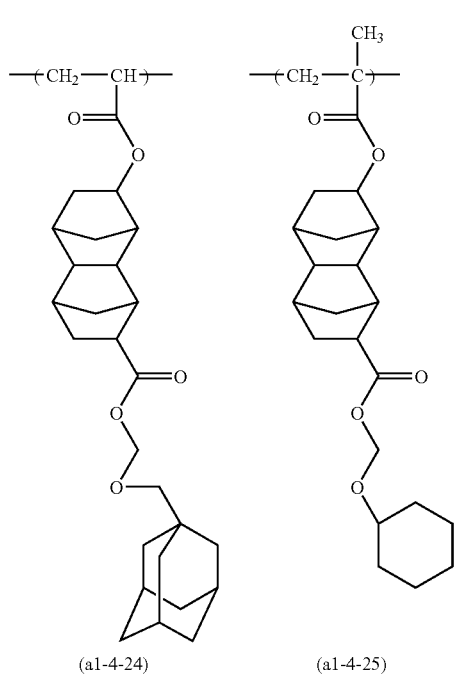
(a1-4-24) (a1-4-25)
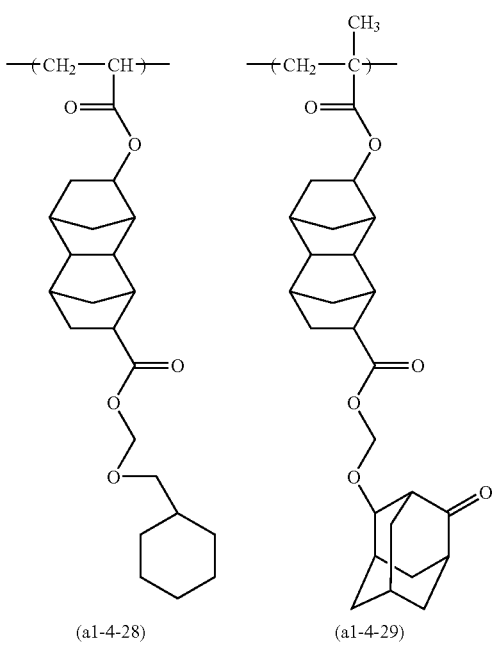
(a1-4-28) (a1-4-29)

-continued

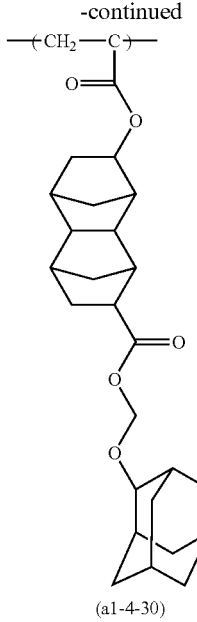

(a1-4-30)

Among these, structural units represented by general formula (a1-1) or (a1-3) are preferable. More specifically, at least one structural unit selected from the group consisting of structural units represented by formulas (a1-1-1) to (a1-1-6), (a1-1-35) to (a1-1-41) and (a1-3-49) to (a1-3-56) is more preferable.

Further, as the structural unit (a1), structural units represented by general formula (a1-1-01) shown below which includes the structural units represented by formulas (a1-1-1) to (a1-1-4), structural units represented by general formula (a1-1-02) shown below which includes the structural units represented by formulas (a1-1-35) to (a1-1-41), structural units represented by general formula (a1-3-01) shown below which includes the structural units represented by formulas (a1-3-49) to (a1-3-52), and structural units represented by general formula (a1-3-02) shown below which includes the structural units represented by formulas (a1-3-53) to (a1-3-56) are also preferable.

[Chemical Formula 23]

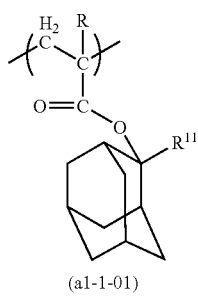

(a1-1-01)

wherein R represents a hydrogen atom, a lower alkyl group or a halogenated lower alkyl group; and $R^{11}$ represents a lower alkyl group.

[Chemical Formula 24]

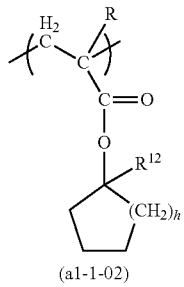

(a1-1-02)

wherein R represents a hydrogen atom, a lower alkyl group or a halogenated lower alkyl group; $R^{12}$ represents a lower alkyl group; and h represents an integer of 1 to 3.

In general formula (a1-1-01), R is as defined above.

The lower alkyl group for $R^{11}$ is the same as the lower alkyl group for R above, and is preferably a methyl group or an ethyl group, and an ethyl group is particularly desirable.

In general formula (a1-1-02), R is as defined above.

The lower alkyl group for $R^{12}$ is the same as the lower alkyl group for R above. $R^{12}$ is preferably a methyl group or an ethyl group, and most preferably an ethyl group. h is preferably 1 or 2, and most preferably 2.

[Chemical Formula 25]

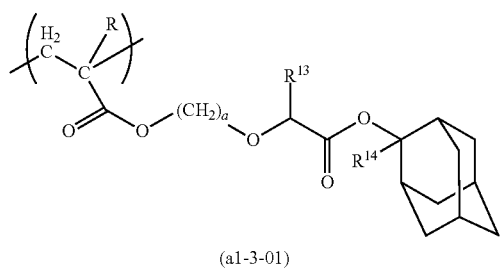

(a1-3-01)

wherein R represents a hydrogen atom, a lower alkyl group or a halogenated lower alkyl group; $R^{14}$ represents a lower alkyl group; $R^{13}$ represents a hydrogen atom or a methyl group; and a represents an integer of 1 to 10.

[Chemical Formula 26]

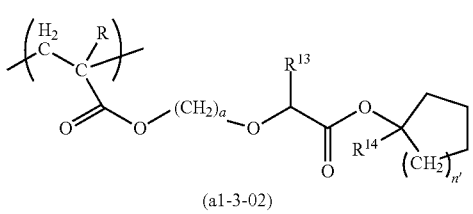

(a1-3-02)

wherein R represents a hydrogen atom, a lower alkyl group or a halogenated lower alkyl group; $R^{14}$ represents a lower alkyl group; $R^{13}$ represents a hydrogen atom or a methyl group; a represents an integer of 1 to 10; and n' represents an integer of 0 to 3.

In general formulas (a1-3-01) and (a1-3 02), R is as defined above.

The lower alkyl group for $R^{14}$ is the same as the lower alkyl group for R, and is preferably a methyl group or an ethyl group.

a is preferably an integer of 1 to 8, more preferably 2 to 5, and most preferably 2.

As the structural unit (a1), one type may be used alone, or two or more types may be used in combination.

In the component (A1), the amount of the structural unit (a1) based on the combined total of all structural units constituting the component (A1) is preferably 10 to 80 mol %, more preferably 20 to 70 mol %, and still more preferably 25 to 50 mol %. By making the amount of the structural unit (a1) at least as large as the lower limit of the above-mentioned range, a pattern can be easily formed using a resist composition prepared from the component (A1). On the other hand, by making the amount of the structural unit (a1) no more than the upper limit of the above-mentioned range, a good balance can be achieved with the other structural units.

A monomer for deriving the structural unit represented by general formula (a1-3-01) above or the structural unit represented by general formula (a1-3-02) above (hereafter, this monomer is referred to as "monomer W") can be produced by a first production method shown below.

First Production Method:

A compound represented by general formula (I-2) shown below is added to a compound represented by general formula (I-1) shown below dissolved in a reaction solvent, in the presence of a base, and a reaction is effected to obtain a compound represented by general formula (I-3) shown below (hereafter referred to as "compound (I-3)"). Then, a compound represented by general formula (I-4) shown below is added to the resulting solution having the compound (I-3) dissolved therein, in the presence of a base, and a reaction is effected to thereby obtain a monomer W.

Examples of the base include inorganic bases such as sodium hydride, $K_2CO_3$ and $Cs_2CO_3$, and organic bases such as triethylamine, 4-dimethylaminopyridine (DMAP) and pyridine.

As the reaction solvent any reaction solvent capable of dissolving the compounds (I-1) and (I-2) as raw materials can be used, and specific examples include tetrahydrofuran (THF), acetone, dimethylformamide (DMF), dimethylacetamide, dimethylsulfoxide (DMSO) and acetonitrile.

[Chemical Formula 27]

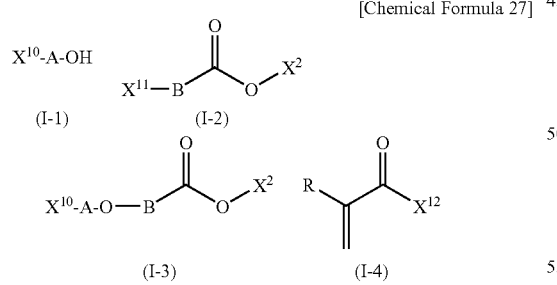

wherein R represents a hydrogen atom, a lower alkyl group or a halogenated lower alkyl group; A represents a divalent hydrocarbon group of 2 or more carbon atoms which may have a substituent; B represents a divalent hydrocarbon group of 1 or more carbon atoms which may have a substituent; $X^2$ represents an acid dissociable, dissolution inhibiting group; each of $X^{10}$ and $X^{12}$ independently represents a hydroxyl group or a halogen atom, with the proviso that either one of $X^{10}$ and $X^{12}$ represents a hydroxyl group and the other represents a halogen atom; and $X^{11}$ represents a halogen atom.

In formulas (I-1) to (I-4) above, R, $X^2$, A and B are as defined above.

As the halogen atom for $X^{10}$ or $X^{12}$, in terms of reactivity, a chlorine atom or a bromine atom is preferable.

As $X^{11}$, in terms of reactivity, a bromine atom or a chlorine atom is preferable, and a bromine atom is particularly desirable.

Structural Unit (a2)

The structural unit (a2) is a structural unit derived from an acrylate ester containing a lactone-containing cyclic group.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group of the structural unit (a2) is effective in improving the adhesion between the resist film and the substrate, and increasing the compatibility with the developing solution containing water.

As the structural unit (a2), there is no particular limitation, and an arbitrary structural unit may be used.

Specific examples of lactone-containing monocyclic groups include groups in which one hydrogen atom has been removed from γ-butyrolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 28]

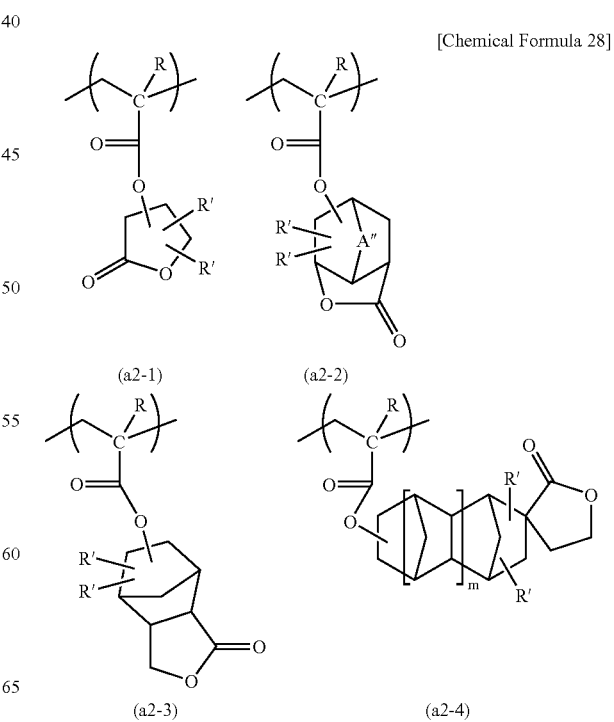

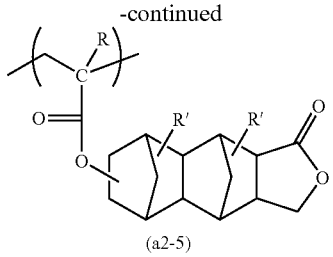

(a2-5)

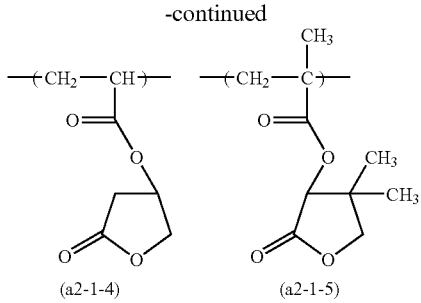

(a2-1-4)    (a2-1-5)

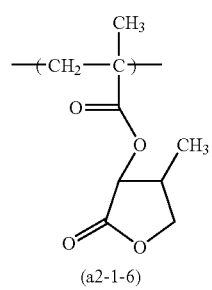

(a2-1-6)

wherein R represents a hydrogen atom, a lower alkyl group or a halogenated lower alkyl group; R' represents a hydrogen atom, a lower alkyl group, an alkoxy group of 1 to 5 carbon atoms or —COOR", wherein R" represents a hydrogen atom or a linear, branched or cyclic alkyl group of 1 to 15 carbon atoms; m represents 0 or 1; and A" represents an alkylene group of 1 to 5 carbon atoms which may contain an oxygen atom or a sulfur atom, an oxygen atom or a sulfur atom.

In general formulas (a2-1) to (a2-5), R is the same as R in the structural unit (a1).

The lower alkyl group for R' is the same as the lower alkyl group for R in the structural unit (a1).

When R" is a linear or branched alkyl group, it preferably has 1 to 10 carbon atoms, more preferably 1 to 5 carbon atoms.

When R" is a cyclic alkyl group, it preferably has 3 to 15 carbon atoms, more preferably 4 to 12 carbon atoms, and most preferably 5 to 10 carbon atoms. Examples thereof include groups in which one or more hydrogen atoms have been removed from a monocycloalkane or a polycycloalkane such as a bicycloalkane, tricycloalkane or tetracycloalkane, and which may or may not be substituted with fluorine atoms or fluorinated alkyl groups. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

In the structural units represented by general formulas (a2-1) to (a2-5), in consideration of industrial availability, R' is preferably a hydrogen atom.

Specific examples of alkylene groups of 1 to 5 carbon atoms for A" include a methylene group, ethylene group, n-propylene group, isopropylene group, —O—CH$_2$—, —CH$_2$—O—CH$_2$—, —S—CH$_2$— and —CH$_2$—S—CH$_2$—.

Specific examples of structural units represented by general formulas (a2-1) to (a2-5) above are shown below.

[Chemical Formula 29]

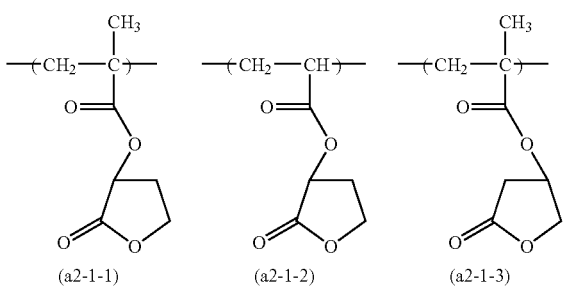

(a2-1-1)    (a2-1-2)    (a2-1-3)

[Chemical Formula 30]

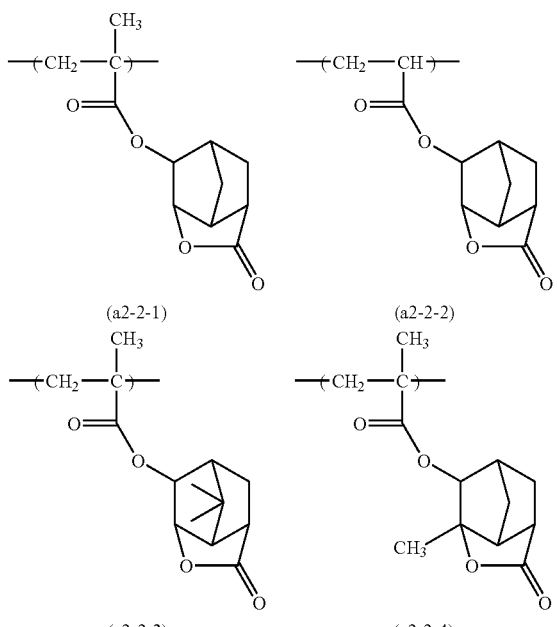

(a2-2-1)    (a2-2-2)

(a2-2-3)    (a2-2-4)

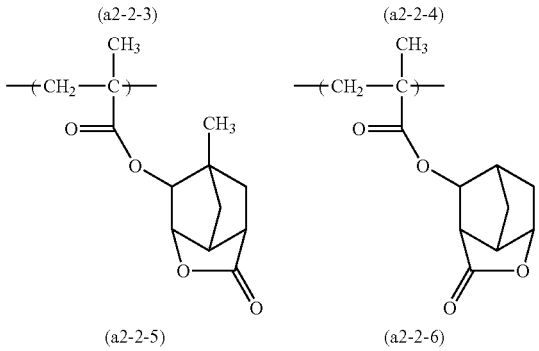

(a2-2-5)    (a2-2-6)

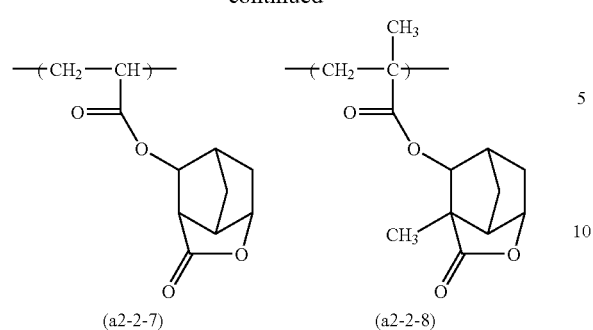
(a2-2-7) (a2-2-8)
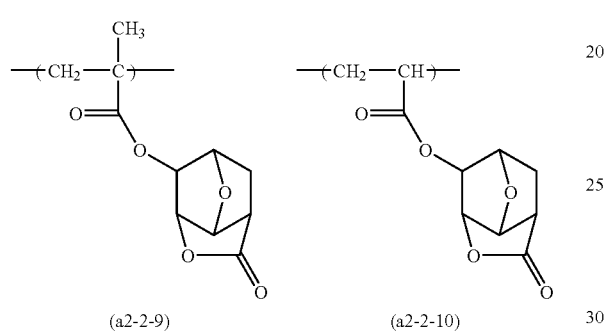
(a2-2-9) (a2-2-10)
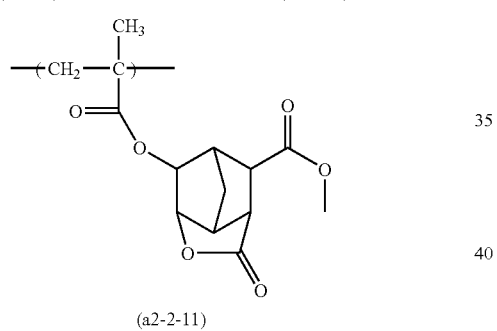
(a2-2-11)
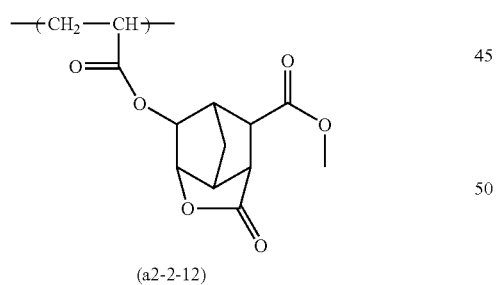
(a2-2-12)
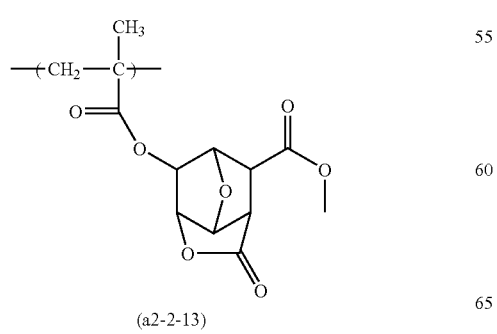
(a2-2-13)
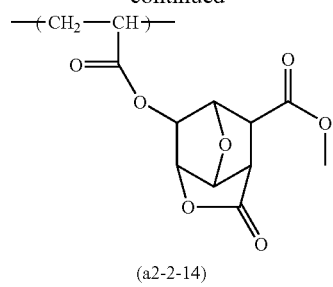
(a2-2-14)
[Chemical Formula 31]
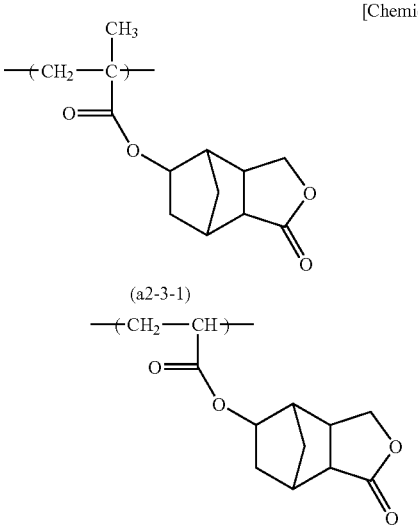
(a2-3-1)
(a2-3-2)
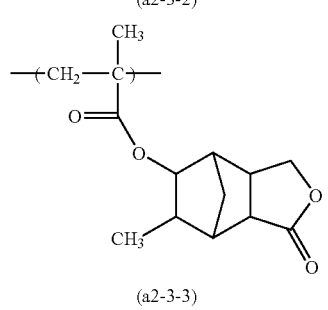
(a2-3-3)
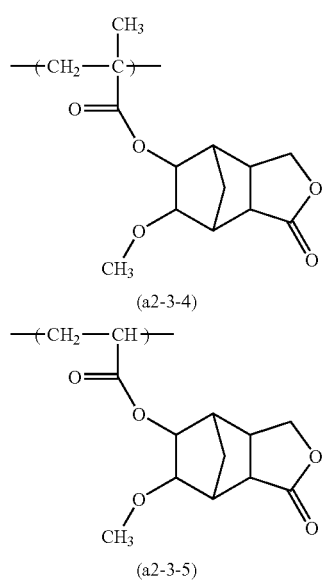
(a2-3-4)
(a2-3-5)

-continued
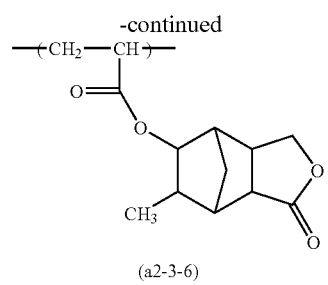
(a2-3-6)
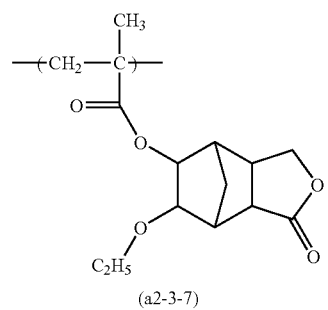
(a2-3-7)
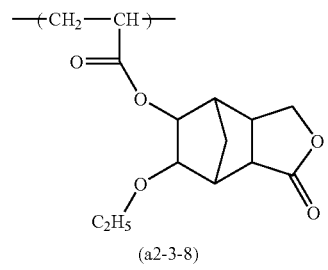
(a2-3-8)
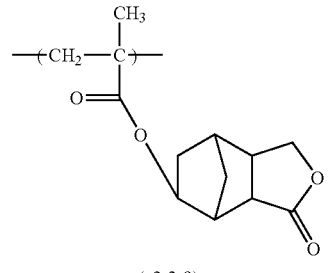
(a2-3-9)
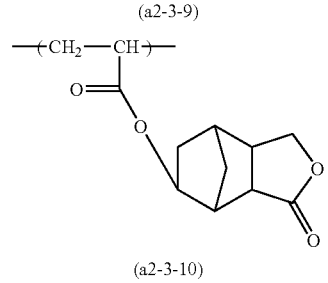
(a2-3-10)
[Chemical Formula 32]
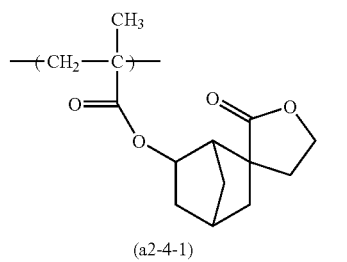
(a2-4-1)
-continued
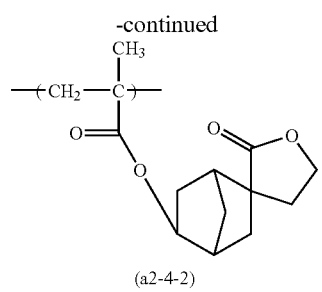
(a2-4-2)
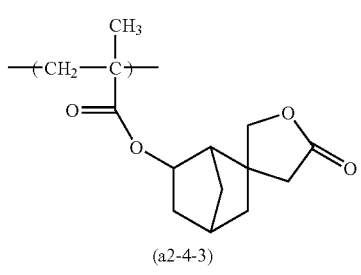
(a2-4-3)
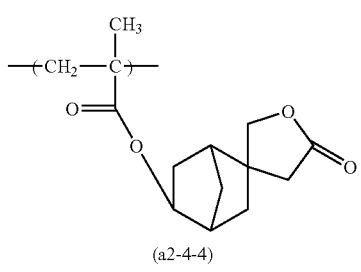
(a2-4-4)
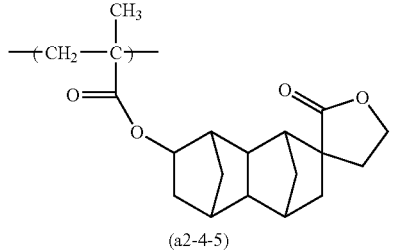
(a2-4-5)
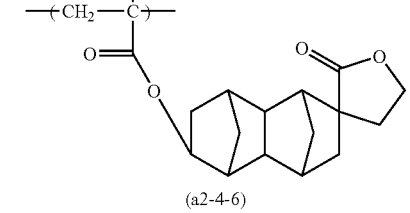
(a2-4-6)
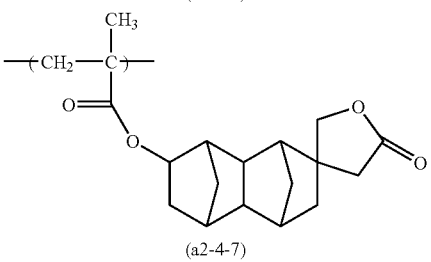
(a2-4-7)

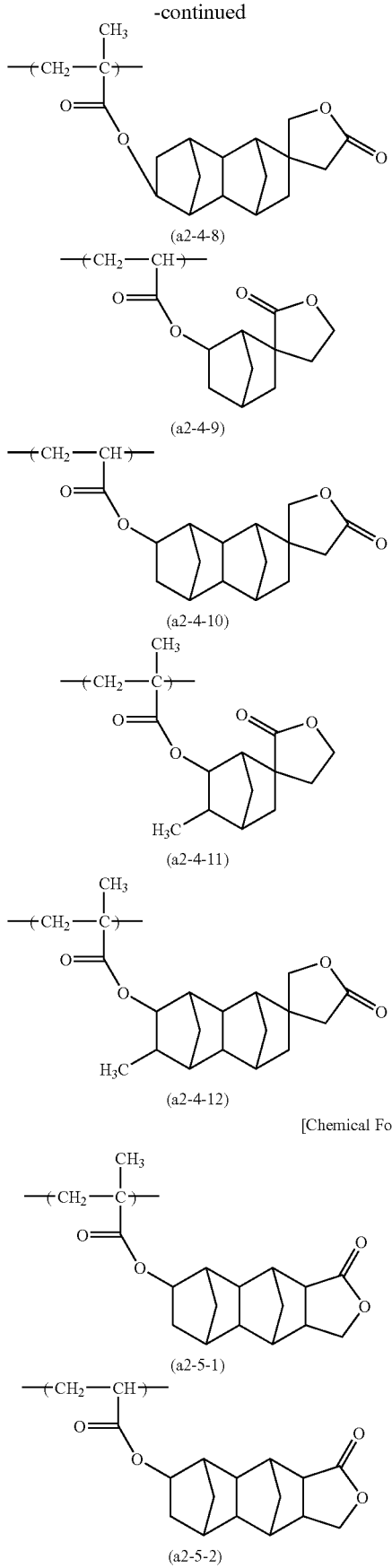

(a2-4-8)
(a2-4-9)
(a2-4-10)
(a2-4-11)
(a2-4-12)

[Chemical Formula 33]

(a2-5-1)
(a2-5-2)

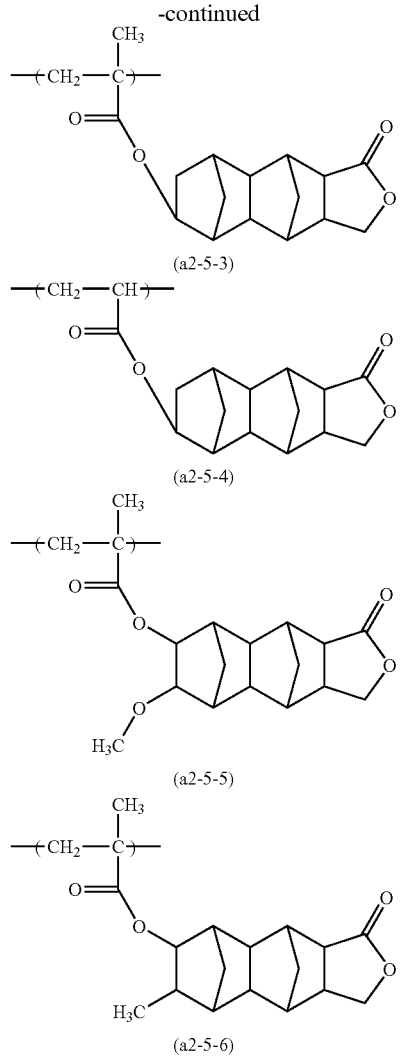

(a2-5-3)
(a2-5-4)
(a2-5-5)
(a2-5-6)

As the structural unit (a2), at least one structural unit selected from the group consisting of formulas (a2-1) to (a2-5) is preferable, and at least one structural unit selected from the group consisting of formulas (a2-1) to (a2-3) is more preferable. Specifically, it is preferable to use at least one structural unit selected from the group consisting of formulas (a2-1-1), (a2-1-2), (a2-2-1), (a2-2-2), (a2-2-9), (a2-2-10), (a2-3-1), (a2-3-2), (a2-3-9) and (a2-3-10), and it is particularly desirable to use at least one structural unit selected from the group consisting of formulas (a2-1-1), (a2-1-2), (a2-2-1) and (a2-2-2).

As the structural unit (a2), one type of structural unit may be used, or two or more types may be used in combination.

In the component (A1), the amount of the structural unit (a2) based on the combined total of all structural units constituting the component (A1) is preferably 5 to 60 mol %, more preferably 10 to 50 mol %, and still more preferably 20 to 50 mol %. By making the amount of the structural unit (a2) at least as large as the lower limit of the above-mentioned range, the effect of using the structural unit (a2) can be satisfactorily achieved. On the other hand, by making the amount of the structural unit (a2) no more than the upper limit of the above-mentioned range, a good balance can be achieved with the other structural units.

Structural Unit (a3)

The structural unit (a3) is a structural unit derived from an acrylate ester containing a polar group-containing aliphatic hydrocarbon group.

When the component (A1) includes the structural unit (a3), the hydrophilicity of the component (A1) is improved, and hence, the compatibility of the component (A1) with the developing solution is improved. As a result, the alkali solubility of the exposed portions improves, which contributes to favorable improvements in the resolution.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups polycyclic groups). These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that include an aliphatic polycyclic group that contains a hydroxyl group, cyano group, carboxyl group or a hydroxyalkyl group in which some of the hydrogen atoms of the alkyl group have been substituted with fluorine atoms are particularly desirable. Examples of polycyclic groups include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2), and (a3-3) shown below are preferable.

[Chemical Formula 34]

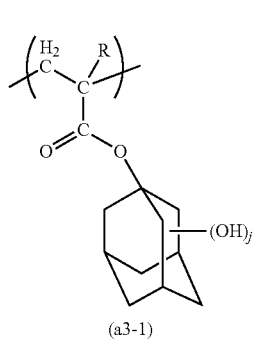
(a3-1)

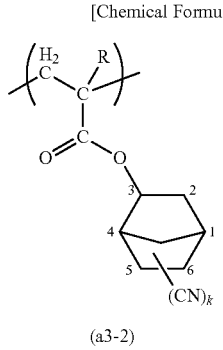
(a3-2)

-continued

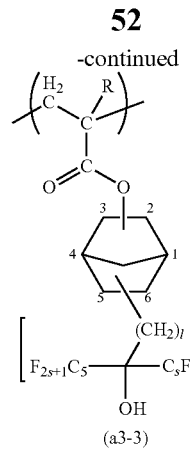
(a3-3)

wherein R is as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1 it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbonyl group.

In formula (a3-3), t' is preferably 1, l is preferably 1 and s is preferably 1.

Further, in formula (a3-3), it is preferable that a 2-norbonyl group or 3-norbonyl group be bonded to the terminal of the carboxy group of the acrylic acid. The fluorinated alkyl alcohol is preferably bonded to the 5th or 6th position of the norbonyl group.

In the component (A1), as the structural unit (a3), one type of structural unit may be used, or two or more types may be used in combination.

When the component (A1) contains the structural unit (a3), the amount of structural unit (a3) based on the combined total of all structural units constituting the component (A1) is preferably 5 to 50 mol %, more preferably 5 to 40 mol %, and still more preferably 5 to 25 mol %. By making the amount of the structural unit (a3) at least as large as the lower limit of the above-mentioned range, the effect of using the structural unit (a3) can be satisfactorily achieved. On the other hand, by making the amount of the structural unit (a3) no more than the upper limit of the above-mentioned range, a good balance can be achieved with the other structural units.

Structural Unit (a4)

The component (A1) may also have a structural unit (a4) which is other than the above-mentioned structural units (a1) to (a3), as long as the effects of the present invention are not impaired.

As the structural unit (a4), any other structural unit which cannot be classified as one of the above structural units (a1) to (a3) can be used without any particular limitations, and any of the multitude of conventional structural units used within resist resins for ArF excimer lasers or KrF excimer lasers (and particularly for ArF excimer lasers) can be used.

As the structural unit (a4), a structural unit which contains a non-acid-dissociable aliphatic polycyclic group, and is also derived from an acrylate ester is preferable. Examples of this polycyclic group include the same groups as those described above in connection with the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may be substituted with a linear or branched alkyl group of 1 to 5 carbon atoms.

Specific examples of the structural unit (a4) include units with sutures represented by general formulas (a4-1) to (a4-5) shown below.

[Chemical Formula 35]

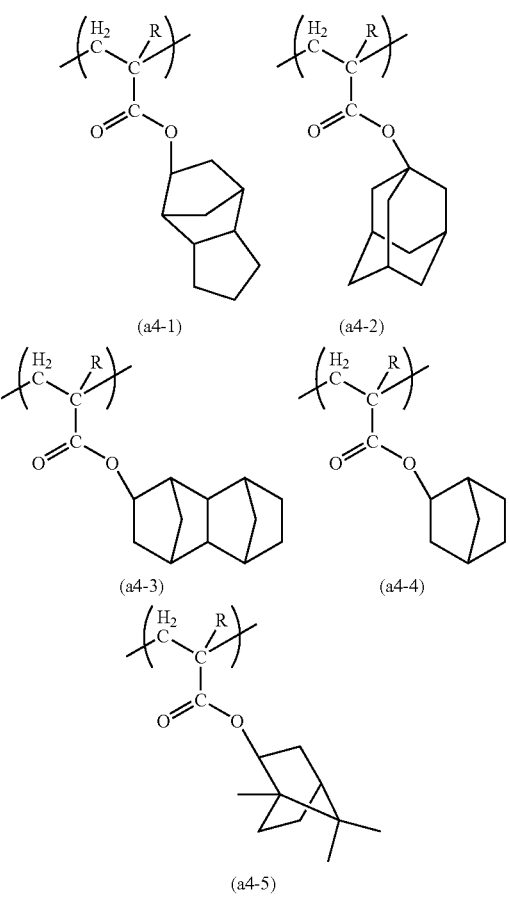

wherein R is as defined above.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

In the present invention, the component (A1) preferably contains a copolymer having the structural units (a1), (a2) and (a3). Examples of such a copolymer include a copolymer consisting of the structural units (a1) and (a2) and (a3), and a copolymer consisting of the structural units (a1), (a2), (a3) and (a4).

As such a copolymer, a copolymer having a combination of 3 structural units in any one of general formulas (A1-11) to (A1-13) shown below is preferable.

[Chemical Formula 36]

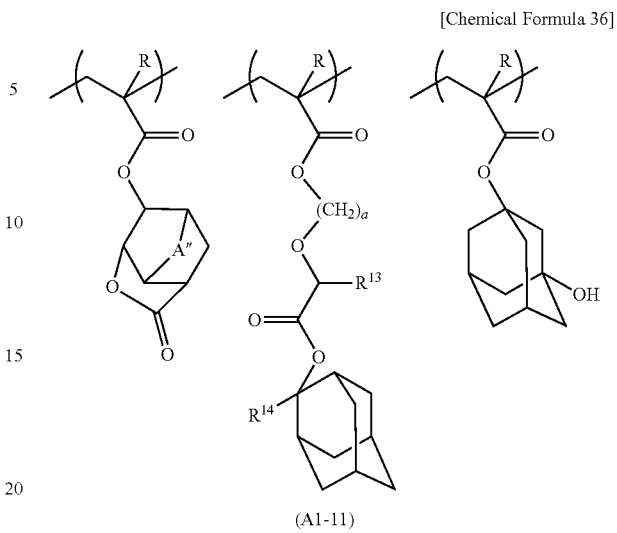

(A1-11)

wherein R, A", a, $R^{13}$ and $R^{14}$ are as defined above, and the plurality of R may be the same or different.

In formula (A1-11) above, a, $R^{13}$ and $R^{14}$ are respectively as defined for a, $R^{13}$ and $R^{14}$ in general formula (a1-3-01) above.

a is preferably an integer of 2 to 5, and most preferably 2.

$R^{13}$ is preferably a hydrogen atom or a methyl group, and most preferably a hydrogen atom.

$R^{14}$ is preferably a methyl group or an ethyl group, and most preferably a methyl group.

A" in formula (A1-11) is as defined for A" in general formula (a2-2) above, and is preferably an oxygen atom, a methylene group or an ethylene group.

R is as defined for R in structural units (a1), (a2) and (a3), and the plurality of R may be the same or different.

[Chemical Formula 37]

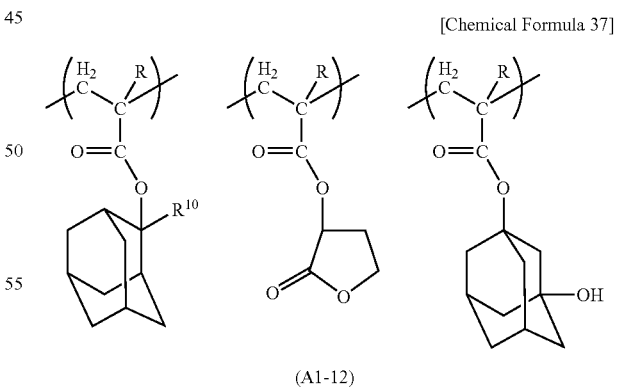

(A1-12)

wherein R is as defined above, wherein the plurality of R may be the same or different; and $R^{10}$ represents a lower alkyl group.

In formula (A1-12), the lower alkyl group for $R^{10}$ is the same as the lower alkyl group for R, and is preferably a methyl group or an ethyl group, and most preferably an ethyl group.

[Chemical Formula 38]

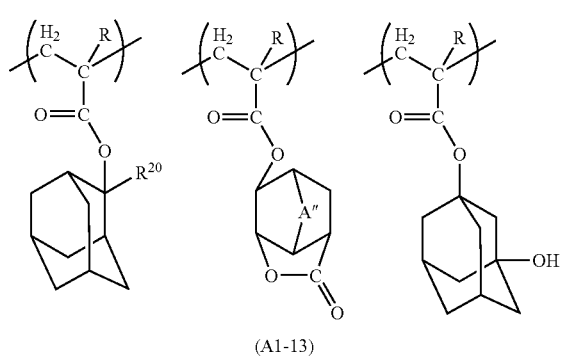

(A1-13)

wherein R and A" are as defined above, wherein the plurality of R may be the same or different; and $R^{20}$ represents a lower alkyl group.

In formula (A1-13), the lower alkyl group for $R^{20}$ is the same as the lower alkyl group for R, and is preferably a methyl group or an ethyl group, and most preferably an ethyl group.

In the resist composition of the present invention, among copolymers having a combination of 3 structural units in any one of general formulas (A1-11) to (A1-13) above, a copolymer having the 3 structural units in general formula (A1-11) is particularly desirable as a copolymer to be used in combination with the nitrogen-containing organic compound (D1).

By using such a copolymer having the 3 structural units in general formula (A1-11) in combination with the nitrogen-containing organic compound (D1), a resist pattern having a further improved shape can be formed.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as HS—$CH_2$—$CH_2$—$CH_2$—$C(CF_3)_2$—OH, a —$C(CF_3)_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

The weight average molecular weight (Mw) (the polystyrene equivalent value determined by gel permeation chromatography) of the component (A1) is not particularly limited, but is preferably 2,000 to 50,000, more preferably 3,000 to 30,000, and most preferably 5,000 to 20,000. By making the weight average molecular weight no more than the upper limit of the above-mentioned range, the component (A1) exhibits satisfactory solubility in a resist solvent when used as a resist. On the other hand, by making the weight average molecular weight at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

[Component (A2)]

As the component (A2), it is preferable to use a compound that has a molecular weight of at least 500 and less than 2,000, contains a hydrophilic group, and also contains an acid dissociable, dissolution inhibiting group exemplified above in connection with the component (A1). Specific examples include compounds containing a plurality of phenol skeletons in which a part of the hydrogen atoms within hydroxyl groups have been substituted with the aforementioned acid dissociable, dissolution-inhibiting groups.

Examples of the component (A2) include low molecular weight phenolic compounds in which a portion of the hydroxyl group hydrogen atoms have been substituted with an aforementioned acid dissociable, dissolution inhibiting group, and these types of compounds are known, for example, as sensitizers or heat resistance improvers for use in non-chemically amplified g-line or i-line resists.

Examples of these low molecular weight phenol compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers and tetramers of formalin condensation products of phenols such as phenol, m-cresol, p-cresol and xylenol. Needless to say, the low molecular weight phenol compound is not limited to these examples.

Also, there are no particular limitations on the acid dissociable, dissolution inhibiting group, and suitable examples include the groups described above.

As the component (A), one type may be used, or two or more types may be used in combination.

In the resist composition of the present invention, the amount of the component (A) can be appropriately adjusted depending on the thickness of the resist film to be formed, and the like.

<Component (B)>

As the component (B), there is no particular limitation, and any of the known acid generators used in conventional chemically amplified resist compositions can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As an onium salt-based acid generator, a compound represented by general formula (b-1) or (b-2) shown below can be used.

[Chemical Formula 39]

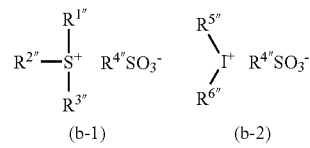

(b-1)  (b-2)

wherein $R^{1''}$ to $R^{3''}$, $R^{5''}$ and $R^{6''}$ each independently represents an aryl group or alkyl group, wherein two of $R^{1''}$ to $R^{3''}$ in formula (b-1) may be bonded to each other to form a ring with the sulfur atom; and $R^{4\prime\prime}$ represents an alkyl group, a halogenated alkyl group, an aryl group or an alkenyl group which may have a substituent, with the proviso that at least one of $R^{1\prime\prime}$ to $R^{3\prime\prime}$ represents an aryl group, and at least one of $R^{5\prime\prime}$ and $R^{6\prime\prime}$ represents an aryl group.

In formula (b-1), $R^{1\prime\prime}$ to $R^{3\prime\prime}$ each independently represents an aryl group or an alkyl group. In formula (b-1), two of $R^{1\prime\prime}$ to $R^{3\prime\prime}$ in formula (b-1) may be bonded to each other to form a ring with the sulfur atom.

Further, among $R^{1\prime\prime}$ to $R^{3\prime\prime}$, at least one group represents an aryl group. Among $R^{1\prime\prime}$ to $R^{3\prime\prime}$, two or more groups are preferably aryl groups, and it is particularly desirable that all of $R^{1\prime\prime}$ to $R^{3\prime\prime}$ are aryl groups.

The aryl group for $R^{1\prime\prime}$ to $R^{3\prime\prime}$ is not particularly limited. For example, an aryl group having 6 to 20 carbon atoms may be used in which some or all of the hydrogen atoms of the aryl group may or may not be substituted with alkyl groups, alkoxy groups, halogen atoms or hydroxyl groups.

The aryl group is preferably an aryl group having 6 to 10 carbon atoms because it can be synthesized at a low cost. Specific examples thereof include a phenyl group and naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

The halogen atom, with which hydrogen atoms of the aryl group may be substituted, is preferably a fluorine atom.

The alkyl group for $R^{1\prime\prime}$ to $R^{3\prime\prime}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

When two of $R^{1\prime\prime}$ to $R^{3\prime\prime}$ in formula (b-1) are bonded to each other to form a ring with the sulfur atom, it is preferable that the two of $R^{1\prime\prime}$ to $R^{3\prime\prime}$ form a 3 to 10-membered ring including the sulfur atom, and it is particularly desirable that the two of $R^{1\prime\prime}$ to $R^{3\prime\prime}$ form a 5 to 7-membered ring including the sulfur atom.

When two of $R^{1\prime\prime}$ to $R^{3\prime\prime}$ in formula (b-1) are bonded to each other to form a ring with the sulfur atom, the remaining one of $R^{1\prime\prime}$ to $R^{3\prime\prime}$ is preferably an aryl group. As examples of the aryl group, the same as the above-mentioned aryl groups for $R^{1\prime\prime}$ to $R^{3\prime\prime}$ can be exemplified.

$R^{4\prime\prime}$ represents an alkyl group, a halogenated alkyl group, an aryl group or an alkenyl group which may have a substituent.

The alkyl group for $R^{4\prime\prime}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As the halogenated alkyl group for $R^{4\prime\prime}$, a group in which a part or all of the hydrogen atoms of the aforementioned linear, branched or cyclic alkyl group have been substituted with halogen atoms can be exemplified. Examples of the halogen atom include a fluorine atom, a chlorine atom, a bromine atom and an iodine atom, and a fluorine atom is particularly desirable.

In the halogenated alkyl group, the percentage of the number of halogen atoms based on the total number of halogen atoms and hydrogen atoms (halogenation ratio (%)) is preferably 10 to 100%, more preferably 50 to 100%, and most preferably 100%. Higher halogenation ratio is preferable because the acid strength increases.

The aryl group for $R^{4\prime\prime}$ is preferably an aryl group of 6 to 20 carbon atoms.

The alkenyl group for $R^{4\prime\prime}$ is preferably an alkenyl group of 2 to 10 carbon atoms.

With respect to $R^{4\prime\prime}$, the expression "may have a substituent" means that a part or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4\prime\prime}$ may have one substituent, or two or more substituents, Examples of the substituent include a halogen atom, a hetero atom, an alkyl group and a group represented by general formula (b-7) shown below.

[Chemical Formula 40]

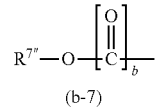

(b-7)

wherein $R^{7\prime\prime}$ represents a monovalent aromatic organic group, a monovalent aliphatic hydrocarbon group which may contain a hetero atom, or a hydroxyl group; and b represents 0 or 1.

As the halogen atom and the alkyl group for the substituent, the same as the halogen atom and alkyl group within the halogenated alkyl group for $R^{4\prime\prime}$ may be exemplified.

Examples of the hetero atom include an oxygen atom, a nitrogen atom and a sulfur atom.

With respect to the group represented by general formula (b-7) above, examples of the monovalent aromatic organic group for $R^{7\prime\prime}$ include aryl groups in which one hydrogen atom has been removed from an aromatic hydrocarbon ring, such as a phenyl group, a biphenyl group, a fluorenyl group, a naphthyl group, an anthryl group, and a phenanthryl group; heteroaryl groups in which a part of the carbon atoms constituting the ring(s) of these groups are substituted with hetero atoms such as an oxygen atom, a sulfur atom, and a nitrogen atom; and arylalkyl groups such as a benzyl group, a phenethyl group, 1-naphthylmethyl group, a 2-naphthylmethyl group, a 1-naphthylethyl group and a 2-naphthylethyl group.

The alkyl chain within the arylalkyl group preferably has 1 to 4 carbon atom, more preferably 1 or 2, and most preferably 1.

These aryl groups, heteroaryl groups and arylalkyl groups may have a substituent such as an alkyl group of 1 to 10 carbon atoms, a halogenated alkyl group, an alkoxy group, a hydroxyl group or a halogen atom. The alkyl group or halogenated alkyl group as the substituent preferably has 1 to 8 carbon atoms, and more preferably 1 to 4 carbon atoms. The halogenated alkyl group is preferably a fluorinated alkyl group. Examples of halogen atoms include a fluorine atom, a chlorine atom, a bromine atom and an iodine atom, and a fluorine atom is preferable.

As the monovalent aromatic organic group for $R^{7\prime\prime}$, an arylalkyl group is preferable, an arylmethyl group is more preferable, and a naphthylmethyl group is most preferable.

As the monovalent aliphatic hydrocarbon group for $R^{7\prime\prime}$ which may contain a hetero atom, for example, a linear, branched or cyclic, monovalent saturated hydrocarbon group of 1 to 15 carbon atoms, or a linear or branched, monovalent unsaturated hydrocarbon group of 2 to 5 carbon atoms can be mentioned.

As the monovalent aliphatic hydrocarbon group which contains a hetero atom, any monovalent aliphatic hydrocarbon group which has a hetero atom in the structure thereof may be used. Examples thereof include any of the aforementioned aliphatic hydrocarbon groups which contains an oxygen atom, a sulfur atom, an ester bond (—C(=O)O—) or the like.

With respect to the aliphatic hydrocarbon group, examples of linear, monovalent saturated hydrocarbon groups include a methyl group, ethyl group, propyl group, butyl group, pentyl group, hexyl group, heptyl group, octyl group, nonyl group and decanyl group.

Examples of branched, monovalent saturated hydrocarbon groups include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The cyclic, monovalent saturated hydrocarbon group may be either a polycyclic group or a monocyclic group. For example, groups in which one hydrogen atom has been removed from a monocycloalkane or a polycycloalkane such as a bicycloalkane, tricycloalkane or tetracycloalkane can be mentioned. Specific examples include groups in which one hydrogen atom has been removed from a monocycloalkane such as cyclopentane, cyclohexane, cycloheptane or cyclooctane; and groups in which one hydrogen atom has been removed from a polycycloalkane such as adamantane, norbornane, isobornane, tricyclodecane or tetracyclododecane.

Examples of linear, monovalent unsaturated hydrocarbon group include a vinyl group, propenyl group (allyl group) and butynyl group.

Examples of branched, monovalent unsaturated hydrocarbon group include 1-methylpropenyl group and 2-methylpropenyl group.

The monovalent aliphatic hydrocarbon group for $R^{7\prime\prime}$ preferably has 2 to 4 carbon atoms, and it is particularly desirable that the monovalent aliphatic hydrocarbon group have 3 carbon atoms.

The hydroxyalkyl group for $R^{7\prime\prime}$ is a linear, branched or cyclic, monovalent saturated hydrocarbon group in which at least one hydrogen atom has been substituted with a hydroxyl group. Linear or branched, monovalent saturated hydrocarbon groups in which one or two hydrogen atoms have been substituted with hydroxyl groups are preferable. Specific examples include a hydroxymethyl group, hydroxyethyl group, 1-hydroxypropyl group, 2-hydroxypropyl group, 3-hydroxypropyl group and 2,3-dihydroxypropyl group.

The monovalent hydroxyalkyl group for $R^{7\prime\prime}$ preferably has 1 to 10 carbon atoms, more preferably 1 to 8 carbon atoms, still more preferably 1 to 6 carbon atoms, and most preferably 1 to 3 carbon atoms.

In formula (b-2), $R^{5\prime\prime\prime}$ and $R^{6\prime\prime\prime}$ each independently represents an aryl group or alkyl group. At least one of $R^{5\prime\prime\prime}$ and $R^{6\prime\prime\prime}$ represents an aryl group. It is preferable that both of $R^{5\prime\prime\prime}$ and $R^{6\prime\prime\prime}$ represent an aryl group.

As the aryl group for $R^{5\prime\prime\prime}$ and $R^{6\prime\prime\prime}$, the same as the aryl groups for $R^{1\prime\prime\prime}$ to $R^{3\prime\prime\prime}$ can be exemplified, As the alkyl group for $R^{5\prime\prime\prime}$ and $R^{6\prime\prime\prime}$, the same as the alkyl groups for $R^{1\prime\prime\prime}$ to $R^{3\prime\prime\prime}$ can be exemplified.

It is particularly desirable that both of $R^{5\prime\prime\prime}$ and $R^{6\prime\prime\prime}$ represents a phenyl group.

As $R^{4\prime\prime\prime}$ in formula (b-2), the same as those mentioned above for $R^{4\prime\prime\prime}$ in formula (b-1) can be exemplified.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts are replaced by methanesulfonate, n-propanesulfonate, n-butanesulfonate, or n-octanesulfonate.

Furthermore, onium salts having a fluorinated alkylsulfonic acid ion (wherein the alkyl has 1 to 10 carbon atoms) containing a group represented by general formula (b-7) above as the anion moiety can be exemplified. For example, an onium salt represented by a chemical formula shown below may be exemplified.

[Chemical Formula 41]

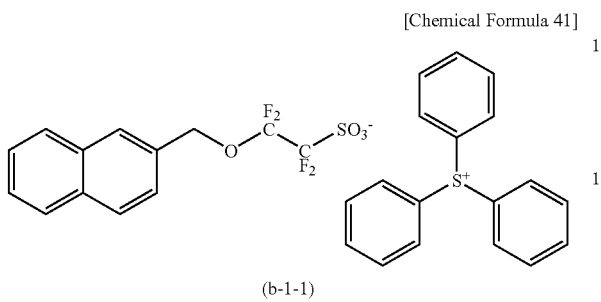

(b-1-1)

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may be used.

[Chemical Formula 42]

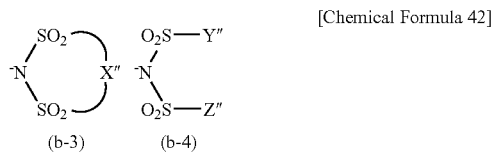

(b-3)　　(b-4)

wherein X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Y" and Z" each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group of X" or those of the alkyl group of Y" and Z" within the range of the number of carbon atoms, the better the solubility in a resist solvent.

Further, in the alkylene group of X" or the allyl group of Y" and Z", it is preferable that the number of hydrogen atoms substituted with fluorine atoms is as large as possible, as the acid strength increases, and the transparency to high energy radiation of 200 nm or less or electron beam is improved. The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Furthermore, as an onium salt-based acid generator, a sulfonium salt having a cation moiety represented by general formula (b-5) or (b-6) shown below may be used.

[Chemical Formula 43]

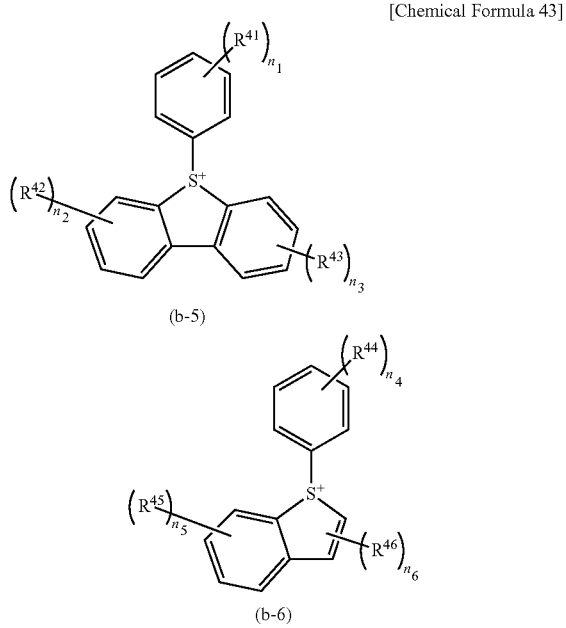

(b-5)

(b-6)

wherein each of $R^{41}$ to $R^{46}$ independently represents an alkyl group, an acetyl group, an alkoxy group, a carboxy group, a hydroxyl group or a hydroxyalkyl group; each of $n_1$ to $n_5$ independently represents an integer of 0 to 3; and $n_6$ represents an integer of 0 to 2.

With respect to $R^{41}$ to $R^{46}$, the alkyl group is preferably an alkyl group of 1 to 5 carbon atoms, more preferably a linear or branched alkyl group, and most preferably a methyl group, ethyl group, propyl group, isopropyl group, n-butyl group or tert butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably the aforementioned alkyl group in which one or more hydrogen atoms have been substituted with hydroxy groups, and examples thereof include a hydroxymethyl group, hydroxyethyl group and hydroxypropyl group.

When the subscripts $n_1$ to $n_6$ of $R^{41}$ to $R^{46}$ represent an integer of 2 or more, the plurality of $R^{41}$ to $R^{46}$ may be the same or different.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties for onium salt-based acid generators which have been proposed may be used. Examples of such anion moieties include fluorinated alkylsulfonic acid ions such as anion moieties ($R^{4"}SO_3^-$) for onium salt-based acid generators represented by general formula (b-1) or (b-2) shown above; anion moieties represented by general formula (b-3) or (b-4) shown above; and anion moieties represented by general formula (b-7) shown above.

In the present description, an oximesulfonate-based acid generator is a compound having at least one group represented by general formula (B-1) shown below, and has a feature of generating acid by irradiation. Such oximesulfonate-based acid generators are widely used for a chemically amplified resist composition, and can be appropriately selected.

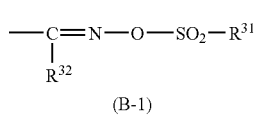

(B-1)

[Chemical Formula 44]

wherein each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "having a substituent" means that some or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

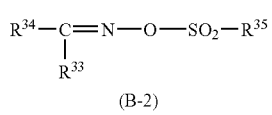

(B-2)

[Chemical Formula 45]

wherein $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

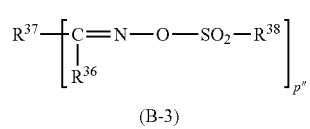

(B-3)

[Chemical Formula 46]

wherein $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2,

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifuoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α[(p-toluenesulfonyloxyimino)-4-methoxyphenyl] acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Further, as preferable examples, the following can be exemplified.

[Chemical Formula 47]

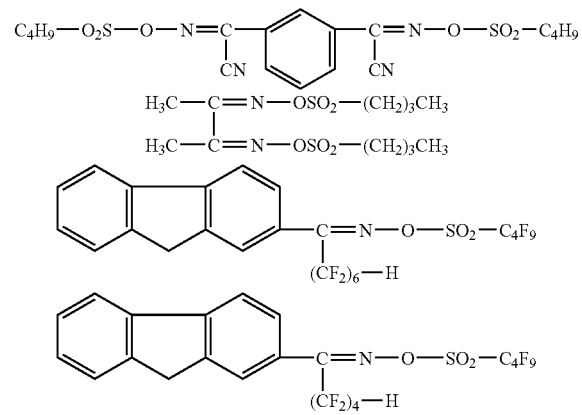

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylethylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be exemplified.

As the component (B), one type of acid generator may be used, or two or more types may be used in combination.

In the present invention, as the component (B), it is preferable to use an onium salt having a fluorinated alkylsulfonic acid ion, which may have a substituent, as the anion moiety.

In the resist composition for immersion exposure according to the present invention, the amount of the component (B) is preferably 0.5 to 30 parts by weight, and more preferably 1 to 10 parts by weight, relative to 100 parts by weight of the component (A). When the amount of the component (B) is within the above-mentioned range, formation of a resist pattern can be satisfactorily performed. Further, by virtue of the above-mentioned range, a uniform solution can be obtained and the storage stability becomes satisfactory.

<Component (D1)>

The resist composition of the present invention contains a nitrogen-containing organic compound (D1) (hereafter, referred to as "component (D1)") having a molecular weight of 200 or more, which is represented by general formula (d1) shown below.

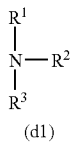

(d1)

[Chemical Formula 48]

wherein each of $R^1$ to $R^3$ independently represents a hydrocarbon group which may have a substituent, with the proviso that at least one of $R^1$ to $R^3$ is a polar group-containing hydrocarbon group, at least one of $R^1$ to $R^3$ is a hydrophobic group, and two of $R^1$ to $R^3$ may be bonded to each other to form a ring with the nitrogen atom.

The molecular weight of the component (D1) is 200 or more, preferably 220 or more, and more preferably 300 or more. By virtue of the molecular weight of the component (D1) being 200 or more, a resist pattern having an excellent shape can be easily formed.

The upper weight of the molecular weight is preferably 1,000 or less, more preferably 800 or less, and still more preferably 700 or less. When the molecular weight is 1,000 or less, the solubility of the component (D1) in a resist solvent (e.g., an organic solvent (S) described below) is enhanced.

In general formula (d1) above, each of $R^1$ to $R^3$ independently represents a hydrocarbon group which may have a substituent, with the proviso that at least one of $R^1$ to $R^3$ is a polar group-containing hydrocarbon group, and at least one of $R^1$ to $R^3$ is a hydrophobic group.

With respect to the hydrocarbon group which may have a substituent, when a hydrocarbon "has a substituent", it means that a part or all of the hydrogen atoms within the hydrocarbon group is substituted with groups or atoms other than hydrogen atom.

The hydrocarbon group may be either an aliphatic hydrocarbon group, or an aromatic hydrocarbon group. An "aliphatic hydrocarbon group" refers to a hydrocarbon group that has no aromaticity.

Examples of the substituent include a halogen atom, a halogenated lower alkyl group of 1 to 5 carbon atoms, a polar group, and a group containing a polar group.

Examples of the halogen atom include a fluorine atom a chlorine atom, a bromine atom and an iodine atom, and a fluorine atom is preferable.

As the halogenated alkyl group, a group in which a part or all of the hydrogen atoms within an alkyl group has been substituted with halogen atoms can be exemplified, and a fluorinated alkyl group is particularly desirable.

With respect to the polar group and the group containing a polar group, preferable examples of the polar group include an ether group (—O—), an ester group, a hydroxy group (—OH), a carbonyl group (—C(=O)—), a carboxy group (—COOH), an oxygen atom (=O), a cyano group (—CN), a lactone ring, an amino group (—NH$_2$) and an amide group (—NHC(=O)—).

The "group containing a polar group" (hereafter, referred to as "polar group-containing substituent") refers to a group which contains a polar group in the structure thereof.

For example, the component (D1) includes compounds containing any of the structures shown below.

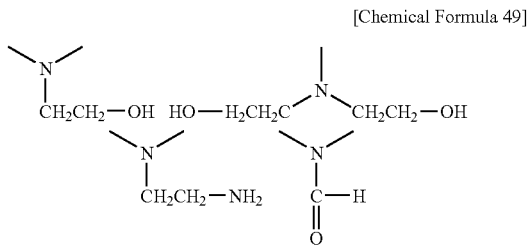

[Chemical Formula 49]

Further, examples of the polar group-containing substituent include an alkyloxy group, a hydroxyalkyloxy group, an alkyloxyalkyloxy group, an alkyloxycarbonyloxy group, an alkoxycarbonylalkyloxy group and an alkyloxycarbonyl group.

The aliphatic hydrocarbon group for $R^1$ to $R^3$ may be either saturated or unsaturated, but in general, the aliphatic hydrocarbon group is preferably saturated.

The aliphatic hydrocarbon group preferably has 1 to 50 carbon atoms, more preferably 2 to 50, and still more preferably 3 to 50.

Examples of the aliphatic hydrocarbon group include a linear, branched or cyclic monovalent saturated hydrocarbon group; and a linear or branched monovalent unsaturated aliphatic hydrocarbon group.

Examples of linear monovalent saturated hydrocarbon groups include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

Examples of branched monovalent saturated hydrocarbon groups include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

Examples of cyclic monovalent saturated hydrocarbon groups include a cyclic saturated hydrocarbon group (a group in which two hydrogen atoms have been removed from a saturated hydrocarbon ring) and a group in which the cyclic saturated hydrocarbon group is bonded to the terminal of the aforementioned linear or branched (chain-like) aliphatic hydrocarbon group or interposed within the aforementioned chain-like aliphatic hydrocarbon group. The cyclic saturated hydrocarbon group may be either a polycyclic group or a monocyclic group. As the cyclic saturated hydrocarbon groups, groups in which one or more hydrogen atoms have been removed from a monocycloalkane or a polycycloalkane such as a bicycloalkane, tricycloalkane or tetracycloalkene can be exemplified. Specific examples include groups in which one or more hydrogen atoms have been removed from a monocycloalkane such as cyclopentane, cyclohexane, cycloheptane or cyclooctane; and groups in which one or more hydrogen atoms have been removed from a polycycloalkane such as adamantane, norbornane, isobornane, dicyclodecane, tricyclodecane or tetracyclododecane.

Examples of linear monovalent unsaturated hydrocarbon groups include a propenyl group (allyl group) and a butynyl group.

Examples of branched monovalent unsaturated hydrocarbon groups include a 1-methylpropenyl group and a 2-methylpropenyl group.

Examples of the aromatic hydrocarbon group for $R^1$ to $R^3$ include aryl groups in which one hydrogen atom has been removed from an aromatic hydrocarbon ring, such as a phenyl group, a biphenyl group, a fluorenyl group, a naphthyl group, an anthryl group, and a phenanthryl group; heteroaryl groups in which a part of the carbon atoms constituting the ring(s) of these groups are substituted with hetero atoms such as an oxygen atom, a sulfur atom, and a nitrogen atom; and arylalkyl groups such as a benzyl group, a phenethyl group, 1-naphthylmethyl group, a 2-naphthylmethyl group, a 1-naphthylethyl group and a 2-naphthylethyl group, The alkyl chain within the arylalkyl group preferably has 1 to 4 carbon atom, more preferably 1 or 2, and most preferably 1.

These aryl groups, heteroaryl groups and arylalkyl groups may have a substituent such as an alkyl group of 1 to 10 carbon atoms, a halogenated alkyl group, an alkoxy group, a hydroxyl group or a halogen atom.

The alkyl group or halogenated alkyl group as the substituent preferably has 1 to 8 carbon atoms, and more preferably 1 to 4 carbon atoms.

The halogenated alkyl group is preferably a fluorinated alkyl group. Examples of halogen atoms include a fluorine atom, a chlorine atom, a bromine atom and an iodine atom, and a fluorine atom is preferable.

In general formula (d1) above, at least one of $R^1$ to $R^3$ is a polar group-containing hydrocarbon group, and at least one of $R^1$ to $R^3$ is a hydrophobic group. By virtue of this feature, the effects of the present invention can be achieved.

With respect to the polar group-containing hydrocarbon group, the polar group may be present at any position within the hydrocarbon group. For example, the polar group may be present at the terminal of the hydrocarbon group, or the polar group may replace a part of the hydrogen atoms at a middle portion of the hydrocarbon chain so as to be present at a middle portion of the hydrocarbon group, or the polar group may be present as a linkage group between carbon atoms constituting the hydrocarbon chain of the hydrocarbon group. Examples of such linkage groups include an ether group (—O—), an ester group, a carbonyl group (—C(=O)—) and an amide group (—NHC(=O)—).

In the hydrocarbon group, one polar group may be present, or a plurality of polar groups mat be present. However, it is preferable that one polar group be present in the hydrocarbon group.

Examples of polar group-containing hydrocarbon groups include a group in which a hydrogen atom at the terminal or a middle portion of the aforementioned aliphatic hydrocarbon group or aromatic hydrocarbon group is substituted with a polar group or the aforementioned polar group-coining substituent; and a group in which the polar group is present as a linkage group at a middle portion of the hydrocarbon chain of the aforementioned aliphatic hydrocarbon group.

Examples of hydrophobic groups include the aforementioned aliphatic hydrocarbon groups, aromatic hydrocarbon groups, aliphatic hydrocarbon groups having a halogen atom or halogenated lower alkyl group bonded thereto, and an aromatic hydrocarbon group having a halogen atom or halogenated lower alkyl group bonded thereto.

In general formula (d1) above, two of $R^1$ to $R^3$ may be bonded to each other to form a ring with the nitrogen atom. In such a case, two of $R^1$ to $R^3$ and the nitrogen atom form a cyclic group.

In this case, the polar group-containing hydrocarbon group may constitute a part or all of the cyclic group. The polar group or polar group-containing substituent may either form a part of the main chain of the ring structure, or bonded to a carbon atom constituting the ring as a substituent.

The cyclic group is preferably a 4- to 7-membered ring including the nitrogen atom, and more preferably a 4- to 6-membered ring including the nitrogen atom.

For example, the component (D1) includes compounds represented by chemical formulas shown below.

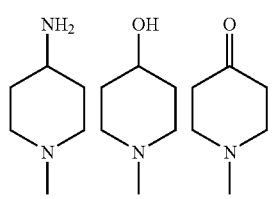

[Chemical Formula 50]

Among these, as the component (D1), a nitrogen-containing organic compound (D1-1) (hereafter, referred to as "component (D1-1)") in which two of $R^1$ to $R^3$ in general formula (d1) are polar group-containing hydrocarbon groups, and the remaining one is a hydrophobic group is preferable in terms of the effects of the present invention.

Among the compounds included in the compound (D1-1), a nitrogen-containing organic compound represented by general formula (d1-1-0) shown below is particularly desirable, as the effects of the present invention become excellent.

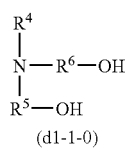

[Chemical Formula 51]

(d1-1-0)

wherein $R^4$ represents an alkyl group of 5 to 50 carbon atoms which may have a substituent; and each of $R^1$ and $R^6$ independently represents an alkylene group of 1 to 30 carbon atoms which may have a substituent.

In general formula (d1-1-0), $R^4$ represents an alkyl group of 5 to 50 carbon atoms which may have a substituent.

As the substituent, the same as the substituent described above in connection with $R^1$ to $R^3$ can be exemplified.

The alkyl group for $R^4$ has 5 to 50 carbon atoms, preferably 5 to 45, more preferably 5 to 40, still more preferably 10 to 20, and most preferably 15 to 20. By virtue of the alkyl group for $R^4$ having at least 5 carbon atoms, resolution is improved. On the other hand, by virtue of the alkyl group for $R^4$ having no more than 50 carbon atoms, the solubility of the component (D1)) in a resist solvent (e.g., an organic solvent (S) described below) is improved.

In general formula (d1-1-0), each of $R^5$ and $R^6$ independently represents an alkylene group of 1 to 30 carbon atoms which may have a substituent.

As the substituent, the same as the substituent described above in connection with $R^1$ to $R^3$ can be exemplified.

Each of the alkylene group for $R^5$ and $R^6$ independently has 1 to 30 carbon atoms, preferably 1 to 25, and more preferably 1 to 20. By virtue of the alkylene group for $R^5$ and $R^6$ having at least 1 carbon atom, resolution and circularity is improved. On the other hand, by virtue of the alkylene group for $R^5$ and $R^6$ having no more than 30 carbon atoms, the solubility of the component (D1) in a resist solvent (e.g., an organic solvent (S) described below) is improved.

Specific examples of compounds preferable as the component (D1) are shown below.

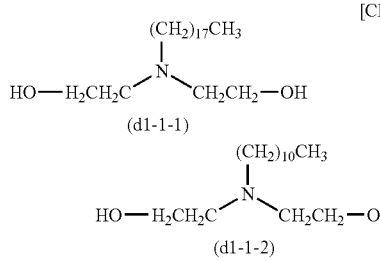

[Chemical Formula 52]

(d1-1-1)

(d1-1-2)

In the resist composition of the present invention, as the component (D1), one type may be used, or two or more types may be used in combination.

In the resist composition of the present invention, the amount of the component (D1) is preferably 0.01 to 5 parts by weight, more preferably 0.01 to 3 parts by weight, and most preferably 0.02 to 2.5 parts by weight, relative to 100 parts by weight of the component (A). By making the amount of the component (D1) at least as large as the lower limit of the above-mentioned range, an excellent resist pattern can be formed. On the other hand, by making the amount of the component (D1) no more than the upper limit of the above-mentioned range, the storage stability becomes satisfactory.

<Optional Component>
[Component (D2)]

In the resist composition of the present invention, for improving the resist pattern shape and the post exposure stability of the latent image formed by the pattern-wise exposure of the resist layer, a nitrogen-containing organic compound (D2) other than the aforementioned component (D1) (hereafter referred to as "component (D2)") can be added as an optional component, as long as the effects of the present invention are not impaired.

A multitude of these components (D2) have already been proposed, and any of these known compounds other than the component (D1) may be used, although a cyclic amine, an aliphatic amine, and particularly a secondary aliphatic amine or tertiary aliphatic amine is preferable. An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines).

Specific examples of alkylamines and alkylalcoholamines include monoalkylamines such as n-hexylamine, n-heptylamine, n-octylamine, n-nonylamine, n-decylamine, and 1-adamantaneamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, tri-n-dodecylamine and dicyclohexylmethylamine; and alkyl alcohol amines such as diethanolamine, triethanolamine, diisopropanolamine, triisopropanolamine, di-n-octanolamine, tri-n-octanolamine, diethylethanolamine, and diethylpropanolamine.

Further, tris(2-(2-methoxyethoxy)ethyl)amine can be exemplified.

Among these, alkylalcoholamines and trialkylamines are preferable, and trialkylamine is particularly desirable. Among trialkylamines, tri-n-pentylamine is particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5,4,0]-7-undecene, hexamethylenetetramine, and 1,4-diazabicyclo[2.2,2]octane.

As the component (D2), any of these compounds can be used either alone, or in combinations of two or more different compounds.

In the resist composition of the present invention, the component (D2) is typically used in an amount within a range from 0.01 to 5.0 parts by weight, relative to 100 parts by weight of the component (A).

[Component (E)]

Furthermore, in the resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

As the component (E), an organic carboxylic acid is preferable, and salicylic acid is particularly desirable.

The component (E) is typically used in an amount within a range from 0.01 to 5.0 parts by weight, relative to 100 parts by weight of the component (A).

If desired, other miscible additives can also be added to the resist composition of the present invention. Examples of such miscible additives include additive resins for improving the performance of the resist film, surfactants for improving the applicability, dissolution inhibitors, plasticizers, stabilizers, colorants, halation prevention agents, and dyes.

[Component (S)]

The resist composition of the present invention can be prepared by dissolving the materials for the resist composition in an organic solvent (S) (hereafter, frequently referred to as "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME), and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the organic solvent is not particularly limited, and is appropriately adjusted to a concentration which enables coating of a coating solution to a substrate, depending on the thickness of the coating film. In general, the organic solvent is used in an amount such that the solid content of the resist composition becomes within the range from 2 to 20% by weight, and preferably from 5 to 15% by weight.

The resist composition of the present invention has the effect that a resist pattern having an excellent shape can be formed. Further, in the formation of a hole pattern, a resist pattern having excellent circularity can be formed. The reasons for these have not been elucidated yet, but are presumed as follows.

In the resist composition of the present invention, a nitrogen-containing organic compound (D1) having a polar group-containing hydrocarbon group and a hydrophobic group having a molecular weight of 200 or more is used.

As the component (D1) has a molecular weight of 200 or more, it hardly transpires to the outside of the resist film during the prebaking in the formation of a resist pattern. Further, by the interaction between the polar group within the polar group-containing hydrocarbon group and other components of the resist composition, the diffusion of the component (D1) is appropriately controlled, and the component (D1) is uniformly diffused.

By virtue of such features, diffusion of acid generated from the component (B) upon exposure can be effectively suppressed, and as a result, it is presumed that a resist pattern having an excellent shape can be formed.

Further, according to the resist composition of the present invention, a resist pattern having an excellent shape can be formed even when the bake temperature in the formation of a resist pattern is set at a low temperature.

Moreover, according to the resist composition of the present invention, in the formation of a hole pattern, thickness loss can be suppressed, and a resist pattern exhibiting excellent perpendicularity can be formed. When thickness loss occurs, the cross-sectional shape of the hole pattern loses rectangularity, and the top portion of the hole becomes round.

<<Method of Forming a Resist Pattern>>

The method of forming a resist pattern according to the second aspect of the present invention includes: applying a resist composition according to the first aspect of the present invention to a substrate to form a resist film on the substrate; conducting exposure of the resist film; and alkali developing the resist film to form a resist pattern.

More specifically, the method for forming a resist pattern according to the present invention can be performed, for example, as follows. Firstly, a resist composition of the present invention is applied onto a substrate using a spinner or the like, and a prebake (post applied bake (PAB)) is conducted under temperature conditions of 80 to 150° C. for 40 to 120 seconds, preferably 60 to 90 seconds to form a resist film. Then, for example, using an ArF exposure apparatus or the like, the resist film is selectively exposed to an ArF excimer laser beam through a desired mask pattern, followed by post exposure bake (PEB) under temperature conditions of 80 to 150° C. for 40 to 120 seconds, preferably 60 to 90 seconds. Subsequently, alkali developing is conducted using an alkali developing solution such as a 0.1 to 10% by weight aqueous solution of tetramethylammonium hydroxide (TMAH), preferably followed by rinsing with pure water, and drying. If desired, bake treatment (post bake) can be conducted following the alkali developing. In this manner, a resist pattern that is faithful to the mask pattern can be obtained.

The substrate is not specifically limited and a conventionally known substrate can be used. For example, substrates for electronic components, and such substrates having wiring patterns formed thereon can be exemplified. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-exemplified substrates provided with an inorganic and/or organic film on the surface thereof may be used. As the inorganic film, an inorganic antireflection film (inorganic BARC) can be exemplified. As the organic film, an organic antireflection film (organic BARC) can be exemplified.

The wavelength to be used for exposure is not particularly limited and the exposure can be conducted using radiations such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV, and particularly effective to ArF excimer laser.

The exposure of the resist film can be either a general exposure (dry exposure) conducted in air or an inert gas such as nitrogen, or immersion exposure (immersion lithography).

In immersion lithography, exposure (immersion exposure) is conducted in a state where the region between the tens and the resist layer formed on a wafer (which was conventionally filled with air or an inert gas such as nitrogen) is filled with a solvent (a immersion medium) that has a larger refractive index than the refractive index of air.

More specifically, in immersion lithography, the region between the resist film formed in the above-described manner and lens at the lowermost portion of the exposure apparatus is filled with a solvent (a immersion medium) that has a larger refractive index than the refractive index of air, and in this state, the resist film is subjected to exposure (immersion exposure) through a desired mask pattern.

The immersion medium preferably exhibits a refractive index larger than the refractive index of air but smaller than the refractive index of the resist film to be subjected to immersion exposure. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

EXAMPLES

As follows is a description of examples of the present invention, although the scope of the present invention is by no way limited by these examples.

<Base Component (A)>

Resins (A)-1 to (A)-4 used as the component (A) in Examples 1 to 21 and Comparative Examples 1 to 15 were produced by copolymerizing monomers (i) to (vi) shown below by a conventional dropwise polymerization method.

[Chemical Formula 53]

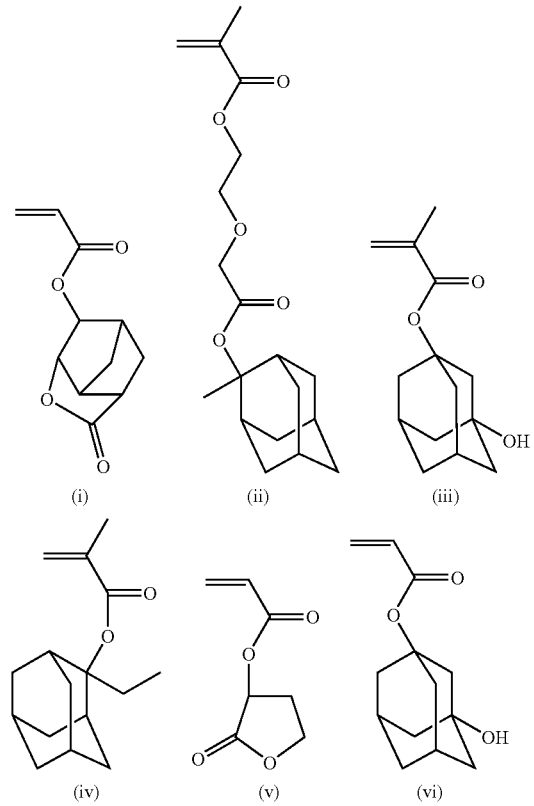

Synthesis Example 1

Synthesis of Resin (A)-1

(Synthesis of Monomer (ii))

4.8 g of sodium hydride (NaH) was charged into a 1 L three-necked flask. While maintaining the temperature of the thee-necked flask at 0° C. in an ice bath, 300 g of tetrahydrofuran (THF) was added, 124 g of a compound (1) was further added while stirring, and stirring was continued for 10 minutes. Then, 30 g of a compound (2) was added while stirring, and a reaction was effected for 12 hours. After the completion of the reaction, the reaction liquid was subjected to suction filtration, and THF was removed from the obtained filtrate by concentration under reduced pressure. Then, water and ethyl acetate was added to the concentrated liquid, and extraction was conducted. The resulting ethyl acetate solution was concentrated under reduced pressure, and purified by column chromatography ($SiO_2$, heptane:ethyl acetate=8:2). The obtained fraction was concentrated and dried under reduced pressure, thereby obtaining 12 g of a compound (3).

[Chemical Formula 54]

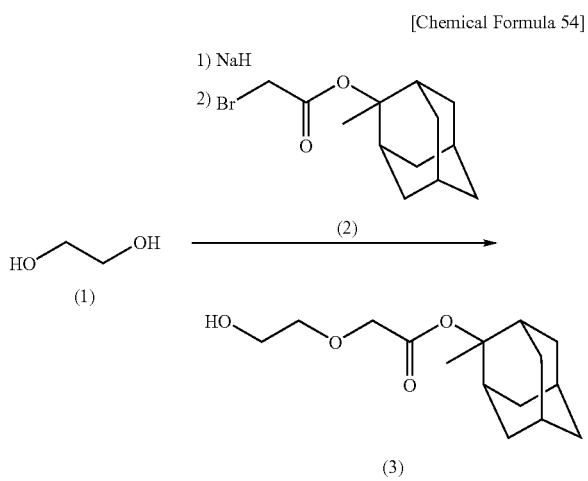

The obtained compound (3) was analyzed by $^1$H-NMR. The results are shown below.

$^1$H-NMR (solvent: CDCl$_3$, 400 MHz): δ(ppm)=4.09 (s, 2H(H$^a$)), 3.75 (t, 2H(H$^b$)), 3.68 (t, 2H(H$^c$)), 3.03 (brs, 2H(H$^d$)), 1.51-2.35 (m, 17H(H$^e$)).

From the results shown above, it was confirmed that the compound (3) had a structure shown below.

[Chemical Formula 55]

Subsequently, 5 g of the compound (3), 3.04 g of triethylamine (Et$_3$N) and 10 g of THF were charged into a 300 mL three-necked flask, and stirred for 10 minutes. Then, 2.09 g of a compound (4) and 10 g of THF were added to the three-necked flask, and a reaction was effected at room temperature for 12 hours. After the completion of the reaction, the reaction liquid was subjected to suction filtration, and THF was removed from the obtained filtrate by concentration under reduced pressure. Then, water and ethyl acetate was added to the concentrated liquid, and extraction was conducted. The resulting ethyl acetate solution was purified by column chromatography (SiO$_2$, heptane:ethyl acetate=8:2). The obtained fraction was concentrated and dried under reduced pressure, thereby obtaining 4.9 g of a compound (5).

[Chemical Formula 56]

The obtained compound (5) was analyzed by $^1$H-NMR. The results are shown below.

$^1$H-NMR (solvent: CDCl$_2$, 400 MHz): δ(ppm)=6.15 (s, 1H(H$^a$)), 5.58 (s, 1H(H$^b$)), 4.35 (t, 2H(H$^c$)), 4.08 (s, 2H(H$^d$)), 3.80 (t, 2H (H$^e$)), 1.51-2.35 (m, 20H(H$^f$)).

From the results shown above, it was confirmed that the compound (5) had a structure shown below.

[Chemical Formula 57]

(Synthesis of Resin (A)-1)

6.19 g of the monomer (i), 10.00 g of the monomer (ii) and 3.51 g of the monomer (iii) were dissolved in 78.8 g of methyl ethyl ketone to obtain a solution. Then, 0.01 mmol of a polymerization initiator (product name: V-601, manufactured by Wako Pure Chemical Industries, Ltd.) was added and dissolved in the obtained solution. The resultant was dropwise added to 32.83 g of methyl ethyl ketone heated to 75° C. in a nitrogen atmosphere over 6 hours. The resulting reaction liquid was heated while stirring for 1 hour, and then cooled to room temperature. Thereafter, the reaction liquid was dropwise added to an excess amount of a methanol/water mixed solution, and an operation to deposit a reaction product was performed three times. The thus obtained reaction product was dried at room temperature under reduced pressure, thereby obtaining a white powder.

The obtained reaction product was designated as "polymeric compound (1)". The structure of the polymeric compound (1) is shown below.

The polymeric compound (1) was analyzed by carbon 13 nuclear magnetic resonance spectroscopy (600 MHz, $^{13}$C-NMR). As a result, it was found that the composition of the polymer (ratio (molar ratio) of the respective structural units within the structural formula) was 1/m/n=40.4/39.1/20.5. Further, with respect to the polymeric compound (1), the weight average molecular weight and the dispersity were determined by the polystyrene equivalent value as measured by gel permeation chromatography (GPC). As a results it was found that the weight average molecular weight was 8,700, and the dispersity was 2.18. From the results above, it was confirmed that the polymeric compound (1) was a copolymer of the monomer (i), the monomer (ii) and the monomer (iii), namely, the resin (A)-1.

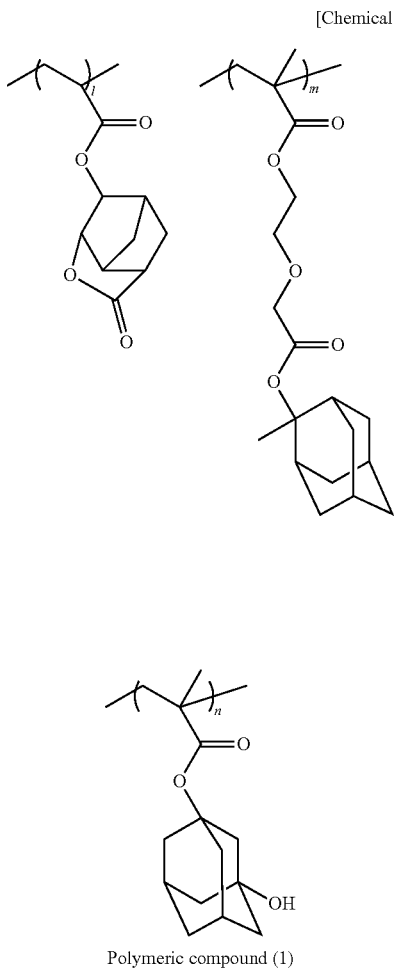

Polymeric compound (1)

Synthesis Example 2

Synthesis of Resins (A)-2 to (A)-4

Resins (A)-2 to (A)-4 used as the component (A) in Examples 2 to 20 were produced by copolymerizing monomers (i) and (iii) to (vi) shown above by a conventional dropwise polymerization method.

With respect to the obtained resins (A)-2 to (A)-4, the weight average molecular weight (Mw) and the dispersity (Mw/Mn) were determined by the polystyrene equivalent value as measured by gel permeation chromatography (GPC).

The structures of the resins (A)-2 to (A)-4 are shown below. In the formulas, each of the subscript numerals at the lower right of the brackets indicate the ratio (mol %) of the structural unit within the resin. The ratio of the structural units was determined by carbon NMR.

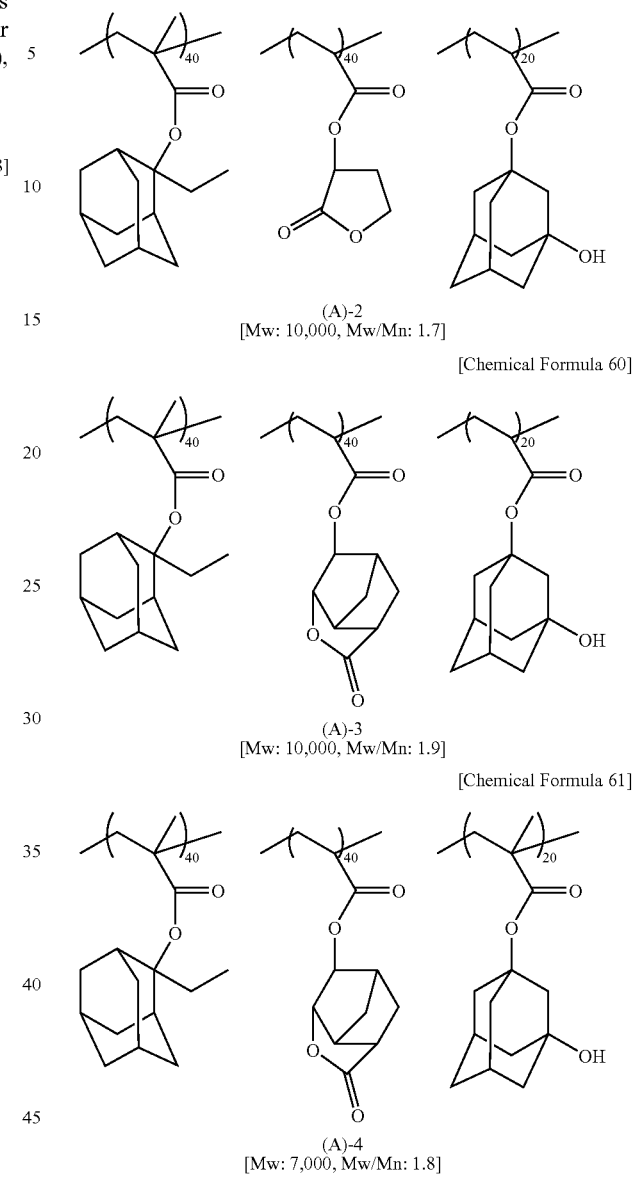

<Production of Resist Compositions>

The components shown in Tables 1 to 4 were mixed together and dissolved to obtain positive resist compositions.

TABLE 1

| | Component (A) | Component (B) | Component (D) | Component (S) |
|---|---|---|---|---|
| Comparative Example 1 | (A)-1 [100] | (B)-1 [4.87] | — | (S)-1 [2500] |
| Comparative Example 2 | (A)-1 [100] | (B)-1 [4.87] | (D)-1 [0.10] | (S)-1 [2500] |
| Comparative Example 3 | (A)-1 [100] | (B)-1 [4.87] | (D)-2 [0.07] | (S)-1 [2500] |
| Comparative Example 4 | (A)-1 [100] | (B)-1 [4.87] | (D)-3 [0.16] | (S)-1 [2500] |
| Example 1 | (A)-1 [100] | (B)-1 [4.87] | (D)-4 [0.16] | (S)-1 [2500] |

TABLE 2

| | Component (A) | Component (B) | Component (D) | Component (S) |
|---|---|---|---|---|
| Example 2 | (A)-2 [100] | (B)-1 [7.5] | (D)-4 [0.08] | (S)-1 [2500] |
| Example 3 | (A)-3 [100] | (B)-1 [7.5] | (D)-4 [0.08] | (S)-1 [2500] |
| Example 4 | (A)-4 [100] | (B)-1 [7.5] | (D)-4 [0.08] | (S)-1 [2500] |
| Example 5 | (A)-2 [100] | (B)-1 [5.0] | (D)-4 [0.08] | (S)-1 [2500] |
| Example 6 | (A)-2 [100] | (B)-1 [6.25] | (D)-4 [0.08] | (S)-1 [2500] |
| Example 7 | (A)-3 [100] | (B)-1 [5.0] | (D)-4 [0.08] | (S)-1 [2500] |
| Example 8 | (A)-3 [100] | (B)-1 [6.25] | (D)-4 [0.08] | (S)-1 [2500] |
| Example 9 | (A)-3 [100] | (B)-1 [8.75] | (D)-4 [0.08] | (S)-1 [2500] |

TABLE 3

| | Component (A) | Component (B) | Component (D) | Component (S) |
|---|---|---|---|---|
| Example 10 | (A)-4 [100] | (B)-1 [2.5] | (D)-4 [0.08] | (S)-1 [2500] |
| Example 11 | (A)-4 [100] | (B)-1 [5.0] | (D)-4 [0.08] | (S)-1 [2500] |
| Example 12 | (A)-4 [100] | (B)-1 [7.5] | (D)-4 [0.08] | (S)-1 [2500] |
| Example 13 | (A)-4 [100] | (B)-1 [2.5] | (D)-4 [0.16] | (S)-1 [2500] |
| Example 14 | (A)-4 [100] | (B)-1 [5.0] | (D)-4 [0.16] | (S)-1 [2500] |
| Example 15 | (A)-4 [100] | (B)-1 [7.5] | (D)-4 [0.16] | (S)-1 [2500] |
| Example 16 | (A)-4 [100] | (B)-1 [2.5] | (D)-4 [0.24] | (S)-1 [2500] |
| Example 17 | (A)-4 [100] | (B)-1 [5.0] | (D)-4 [0.24] | (S)-1 [2500] |
| Example 18 | (A)-4 [100] | (B)-1 [7.5] | (D)-4 [0.24] | (S)-1 [2500] |
| Example 19 | (A)-2 [100] | (B)-2 [6.4] | (D)-4 [0.08] | (S)-1 [2500] |
| Example 20 | (A)-2 [100] | (B)-1 [7.5] | (D)-4 [0.08] | (S)-1 [2500] |

TABLE 4

| | Component (A) | Component (B) | Component (D) | Component (S) |
|---|---|---|---|---|
| Example 21 | (A)-1 [100] | (B)-1 [4.87] | (D)-4 [0.31] | (S)-1 [2500] |
| Comparative Example 5 | (A)-1 [100] | (B)-1 [4.87] | — | (S)-1 [2500] |
| Comparative Example 6 | (A)-1 [100] | (B)-1 [4.87] | (D)-1 [0.20] | (S)-1 [2500] |
| Comparative Example 7 | (A)-1 [100] | (B)-1 [4.87] | (D)-2 [0.13] | (S)-1 [2500] |
| Comparative Example 8 | (A)-1 [100] | (B)-1 [4.87] | (D)-3 [0.31] | (S)-1 [2500] |
| Comparative Example 9 | (A)-1 [100] | (B)-1 [4.87] | (D)-5 [0.16] | (S)-1 [2500] |
| Comparative Example 10 | (A)-1 [100] | (B)-1 [4.87] | (D)-6 [0.17] | (S)-1 [2500] |
| Comparative Example 11 | (A)-1 [100] | (B)-1 [4.87] | (D)-7 [0.10] | (S)-1 [2500] |
| Comparative Example 12 | (A)-1 [100] | (B)-1 [4.87] | (D)-8 [0.12] | (S)-1 [2500] |
| Comparative Example 13 | (A)-1 [100] | (B)-1 [4.87] | (D)-9 [0.28] | (S)-1 [2500] |
| Comparative Example 14 | (A)-1 [100] | (B)-1 [4.87] | (D)-10 [0.17] | (S)-1 [2500] |

TABLE 4-continued

| | Component (A) | Component (B) | Component (D) | Component (S) |
|---|---|---|---|---|
| Comparative Example 15 | (A)-1 [100] | (B)-1 [4.87] | (D)-11 [0.13] | (S)-1 [2500] |

In Tables 1 to 4, the reference characters indicate the following. Further, the values in brackets [ ] indicate the amount (in terns of parts by weight) of the component added.

(A)-1: the aforementioned resin (A)-1

(A)-2: the aforementioned resin (A)-2

(A)-3: the aforementioned resin (A)-3

(A)-4: the aforementioned resin (A)-4

(B)-1: an acid generator represented by chemical formula (b-1-1) shown below (B)-2: triphenylsulfonium heptafluoro-n-propanesulfonate

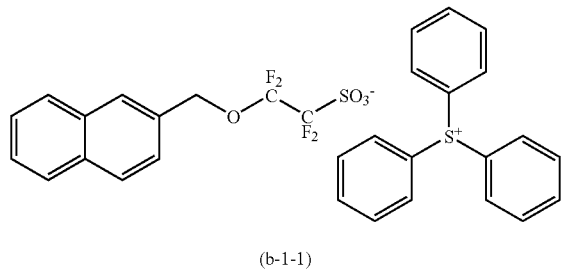

(b-1-1)

The acid generator (B)-1 represented by chemical formula (b-1-1) above was produced as follows. 6.99 g of triphenylsulfoniumbromide was dissolved in 125 ml of pure water to obtain a solution. 5.50 g of a lithium salt of 2-naphthylmethyloxytetrafluoroethanesulfonic acid was added to the obtained solution and stirred at room temperature for 19 hours. Then, 125 g of dichloromethane was added to the resultant, and the organic phase was separated and taken out. The organic phase was washed with 40 ml of pure water, and the organic phase was separated and taken out. The organic phase was concentrated and dried, thereby obtaining the acid generator (B)-1.

(D)-1: tri-n-pentylamine (molecular weight: 227.43)

(D)-2: triethanolamine (molecular weight: 149.19)

(D)-3: tri-n-octylamine (molecular weight: 353.67)

(D)-4: a nitrogen-containing organic compound represented by chemical formula (d1-1-1) shown below (stearildiethanolamine) (molecular weight: 357.61)

(D)-5: tri-n-butylamine (TBA) (molecular weight: 185.35)

(D)-6: triisopropanolamine (molecular weight: 191.27)

(D)-7: diethylethanolamine (molecular weight: 117.19)

(D)-8: diethylpropanolamine (molecular weight: 131.22)

(D)-9: tris[2-(2-methoxyethoxy)ethyl]amine (molecular weight: 323.43)

(D)-10: dicyclohexylmethylamine (molecular weight: 195.34)

(D)-11: 1-adamantaneamine (molecular weight: 151.25)

(S)-1: a mixed solvent of PGMEA/PGME=6/4 (weight ratio)

[Chemical Formula 63]

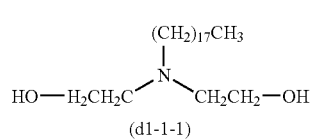

(d1-1-1)

<Evaluation of the Shape of Resist Pattern>

Using the obtained positive resist compositions, resist patterns were formed in the following manner, and lithography properties were evaluated.

Example 1, Comparative Examples 1 to 4

[Resolution•Sensitivity]

An organic anti-reflection film composition (product name: ARC29, manufactured by Brewer Science Ltd.) was applied onto an 8-inch silicon wafer using a spinner, and the composition was then baked at 205° C. for 60 seconds, thereby forming an organic anti-reflection film having a film thickness of 82 nm. Then, each of the positive resist compositions obtained in Example 1 and Comparative Examples 1 to 4 was applied onto the anti-reflection film using a spinner, and was then prebaked (PAB) on a hotplate at 100° C. for 60 seconds and dried, thereby forming a resist film having a film thickness of 120 nm.

Subsequently, the resist film was selectively irradiated with an ArF excimer laser (193 nm) through a mask pattern (6% halftone), using an ArF exposure apparatus NSR-S302 (manufactured by Nikon Corporation, NA (numerical aperture)=0.60, 2/3 annular illumination). Thereafter, a post exposure bake (PEB) treatment was conducted at 100° C. for 60 seconds, followed by alkali development for 30 seconds at 23° C. in a 2.38% by weight aqueous solution of tetranethylammonium hydroxide (TMAH). Then, the resist was washed for 30 seconds with pure water, followed by drying by shaking, thereby forming a resist pattern.

As a result, in each of the examples, a contact hole pattern in which a hole diameter of 130 nm was equally spaced (pitch: 260 nm) was formed on the resist film.

The optimum exposure dose (Eop, mJ/cm$^2$) with which the contact hole pattern having a hole diameter of 130 nm and a pitch of 260 nm was formed, i.e., sensitivity, was determined. The results are shown in Table 5.

Example 2 to 9

[Resolution•Sensitivity]

An organic anti-reflection film composition (product name: ARC29A, manufactured by Brewer Science Ltd.) was applied onto an 8-inch silicon wafer using a spinner, and the composition was then baked at 205° C. for 60 seconds, thereby forming an organic anti-reflection film having a film thickness of 89 nm. Then, each of the positive resist compositions obtained in Examples 2 to 9 was applied onto the anti-reflection film using a spinner, and was then prebaked (PAB) on a hotplate at 90° C. for 60 seconds and dried, thereby forming a resist film having a film thickness of 120 nm.

Subsequently, a coating solution for forming a protection film (product name: TSRC-002; manufactured by Tokyo Ohka Kogyo Co., Ltd.) was applied onto the resist film using a spinner, and then heated at 90° C. for 60 seconds, thereby forming a top coat with a film thickness of 29 nm.

Thereafter, using an ArF exposure apparatus for immersion lithography (product name: NSR-S609B, manufactured by Nikon Corporation, NA (numerical aperture)=1.07, 2/3 annular illumination, reduction ratio: 1/4, immersion medium: water), the resist film having a top coat formed thereon was selectively irradiated with an ArF excimer laser (193 nm) through a mask pattern (6% halftone).

Next, the top coat was removed using a protection-film removing solution (product name: TS-Rememover-S; manufactured by Tokyo Ohka Kogyo Co., Ltd.). Then, a post exposure bake (PEB) treatment was conducted at 95° C. for 60 seconds, followed by alkali development for 30 seconds at 23° C. in a 2.38% by weight aqueous solution of tetramethylammonium hydroxide (product name: NMD-W; manufactured by Tokyo Ohka Kogyo Co., Ltd.). Then, the resist film was rinsed for 25 seconds with pure water, followed by drying by shaking.

As a result, in each of the examples, a contact hole pattern in which a hole diameter of 70 nm was equally spaced (pitch: 150 nm) was formed on the resist film.

The optimum exposure dose (Eop, mJ/cm$^2$) with which the contact hole pattern having a hole diameter of 70 nm and a pitch of 150 nm was formed, i.e., sensitivity, was determined. The results are shown in Table 5.

Examples 10 to 20

[Resolution•Sensitivity]

An organic anti-reflection film composition (product name: ARC29, manufactured by Brewer Science Ltd.) was applied onto an 8-inch silicon wafer using a spinner, and the composition was then baked at 205° C. for 60 seconds, thereby forming an organic anti-reflection film having a film thickness of 82 nm. Then, each of the positive resist compositions obtained in Examples 10 to 20 was applied onto the anti-reflection film using a spinner, and was then prebaked (PAB) on a hotplate at 90° C. for 60 seconds and dried, thereby forming a resist film having a film thickness of 120 nm.

Subsequently, the resist film was selectively irradiated with an ArF excimer laser (193 nm) through a mask pattern (6% halftone), using an ArF exposure apparatus NSR-S302 (manufactured by Nikon Corporation, NA (numerical aperture)=0.60, 2/3 annular illumination). Thereafter, a post exposure bake (PEB) treatment was conducted at 90° C. for 60 seconds, followed by alkali development for 30 seconds at 23° C. in a 2.38% by weight aqueous solution of tetramethylammonium hydroxide (product name: NMD-3; manufactured by Tokyo Ohka Kogyo Co., Ltd.). Then, the resist was washed for 30 seconds with pure water, followed by drying by shaking, thereby forming a resist pattern.

As a result, in each of the examples, a contact hole pattern in which a hole diameter of 130 nm was equally spaced (pitch: 260 nm) was formed on the resist film.

The optimum exposure dose (Eop, mJ/cm$^2$) with which the contact hole pattern having a hole diameter of 130 nm and a pitch of 260 nm was formed, i.e., sensitivity, was determined. The results are shown in Table 5.

Example 21 and Comparative Examples 5 to 15

[Resolution•Sensitivity]

The evaluation of resolution•sensitivity in Example 21 and Comparative Examples 5 to 15 was performed in substantially the same manner as in the evaluation of resolution·sensitivity in Example 1 and Comparative Examples 1 to 4, except that the positive resist compositions obtained in Example 21 and Comparative Examples 5 to 15 were used, thereby forming contact hole patterns in which a hole diameter of 130 nm was equally spaced (pitch: 260 nm).

The optimum exposure dose (Eop, mJ/cm$^2$) with which the contact hole pattern having a hole diameter of 130 nm and a pitch of 260 nm was formed, i.e., sensitivity, was determined. The results are shown in Table 6.

[Evaluation of Circularity]

Each of the contact hole patterns formed in the manner described above was observed from the upper side thereof using a scanning electron microscope, and the circularity was evaluated with the following criteria. The results are shown in Tables 5 and 6.

A: extremely high circularity (no unevenness was observed at the circumferential portions of the hole pattern when the hole pattern was observed from the upper side thereof, and the shape of the pattern was excellent)

B: high circularity (although slight unevenness was observed at the circumferential portions of the hole pattern when the hole pattern was observed from the upper side thereof, the pattern as a whole had a high level of circularity)

C: low circularity (unevenness was observed at many of the circumferential portions of the hole pattern when the hole pattern was observed from the upper side thereof)

[Evaluation of Thickness Loss]

With respect to the contact hole patterns formed in the manner described above in [Resolution·sensitivity] using the positive resist compositions obtained in Example 21 and Comparative Examples 5 to 15, the cross section was observed using a scanning electron microscope, and the thickness loss was evaluated in accordance with the following criteria. The results are shown in Table 6

A: no thickness loss was observed

B: thickness loss was observed

TABLE 5

| | Eop (mJ/cm$^2$) | Circularity |
|---|---|---|
| Comparative Example 1 | 4.0 | C |
| Comparative Example 2 | 10.0 | C |
| Comparative Example 3 | 10.0 | C |
| Comparative Example 4 | 10.0 | C |
| Example 1 | 10.0 | A |
| Example 2 | 15.0 | B |
| Example 3 | 43.0 | A |
| Example 4 | 46.0 | B |
| Example 5 | 21.0 | B |
| Example 6 | 17.0 | A |
| Example 7 | 65.0 | B |
| Example 8 | 51.0 | A |
| Example 9 | 38.0 | B |
| Example 10 | 49.51 | B |
| Example 11 | 23.59 | B |
| Example 12 | 15.15 | A |
| Example 13 | 57.62 | B |
| Example 14 | 28.10 | B |
| Example 15 | 17.84 | B |
| Example 16 | 66.75 | B |
| Example 17 | 31.33 | B |
| Example 18 | 20.35 | B |
| Example 19 | 11.0 | B |
| Example 20 | 15.0 | B |

TABLE 6

| | Eop (mJ/cm$^2$) | Circularity | Thickness loss |
|---|---|---|---|
| Example 21 | 20.4 | B | A |
| Comparative Example 5 | 4.0 | C | A |
| Comparative Example 6 | 14.1 | C | B |
| Comparative Example 7 | 12.0 | C | B |
| Comparative Example 8 | 15.9 | C | B |
| Comparative Example 9 | 7.8 | C | B |
| Comparative Example 10 | 14.7 | C | B |
| Comparative Example 11 | 5.7 | C | A |
| Comparative Example 12 | 5.4 | C | A |
| Comparative Example 13 | 15.0 | C | B |
| Comparative Example 14 | 15.0 | C | B |
| Comparative Example 15 | 11.7 | C | B |

As seen from the results, with respect to the positive resist composition of Example 1 that contains a nitrogen-containing organic compound (D1) according to the present invention, the circularity of the hole pattern formed was extremely high as compared to the hole patterns formed using the positive resist composition of Comparative Example 1 that contains no component (D1) and the positive resist compositions of Comparative Examples 2 to 4 that contains a nitrogen-containing organic compound outside the scope of the present invention. Thus, it was confirmed that a resist pattern having an excellent shape can formed using the resist composition of the present invention.

Further, with respect to the positive resist compositions of Examples 2 to 20 that contain a nitrogen-containing organic compound (D1) according to the present invention, the circularity of the hole pattern formed was high. Thus, it was confined that a resist pattern having an excellent shape can formed using the resist composition of the present invention.

Further, from the evaluation results of Comparative Examples 2 and 4, it was confirmed that the circularity of the resist pattern tends to be improved as the molecular weight of the component (D) becomes larger.

Furthermore, from a comparison of Example 1 and Comparative Example 4 in which the component (D) used had about the same molecular weight, it was confirmed that a resist pattern with an excellent circularity and shape can be formed by virtue of the component (D1) containing a hydroxy group (polar group) within the molecule thereof.

Further, with respect to the positive resist composition of Example 21 that contains a nitrogen-containing organic compound (D1) according to the present invention, the circularity of the hole pattern formed was high as compared to the hole patterns formed using the positive resist composition of Comparative Examples 5 to 15. Thus, it was confirmed that a resist pattern having an excellent shape can formed using the resist composition of the present invention.

Furthermore, the positive resist composition of Example 21 was advantageous not only in that the circularity of the hole pattern formed was high, but also thickness loss was suppressed, and it was confirmed that a resist pattern having a high perpendicularity could be formed.

With respect to the positive resist compositions of Comparative Examples 5, 11 and 12, although thickness loss was suppressed, the perpendicularity of the hole pattern formed was poor, and the shape of the hole pattern was poor as compared to the hole pattern formed using the positive resist composition of Example 21.

The invention claimed is:

1. A resist composition comprising:
  a base component (A) which exhibits changed solubility in an alkali developing solution under action of acid, an acid-generator component (B) which generates acid upon exposure, and a nitrogen-containing organic compound (D1) having a molecular weight of 200 or more, which is represented by general formula (d1-1-0) shown below:

[Chemical Formula 2]

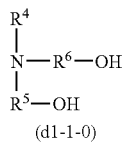

(d1-1-0)

wherein $R^4$ represents an alkyl group of 15 to 50 carbon atoms which may have a substituent; and each of $R^5$ and $R^6$ independently represents an alkylene group of 1 to 30 carbon atoms which may have a substituent.

2. The resist composition according to claim 1, wherein said base component (A) is a base component (A') which exhibits increased solubility in an alkali developing solution under action of acid.

3. The resist composition according to claim 2, wherein said base component (A') is a resin component (A1) comprising a structural unit (a1) derived from an acrylate ester containing an acid dissociable, dissolution inhibiting group.

4. The resist composition according to claim 3, wherein said resin component (A1) further comprises a structural unit (a2) derived from an acrylate ester containing a lactone-containing cyclic group.

5. The resist composition according to claim 3, wherein said resin component (A1) further comprises a structural unit (a3) derived from an acrylate ester containing a polar group-containing aliphatic hydrocarbon group.

6. A method of forming a resist pattern, comprising: applying a resist composition of any one of claims 1 and 2-5 to a substrate to form a resist film on the substrate; conducting exposure of said resist film; and alkali-developing said resist film to form a resist pattern.

7. The resist composition according to claim 3, wherein said structural unit (a1) comprises at least one member selected from the group consisting of a structural unit represented by general formula (a1-3-01) shown below and a structural unit represented by general formula (a1-3-02) shown below:

[Chemical Formula 1.]

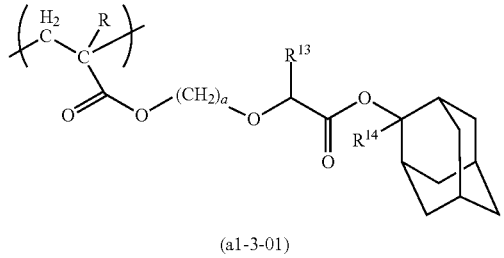

(a1-3-01)

wherein R represents a hydrogen atom, a lower alkyl group or a halogenated lower alkyl group; $R^{14}$ represents a lower alkyl group; $R^{13}$ represents a hydrogen atom or a methyl group; and a represents an integer of 1 to 10; and

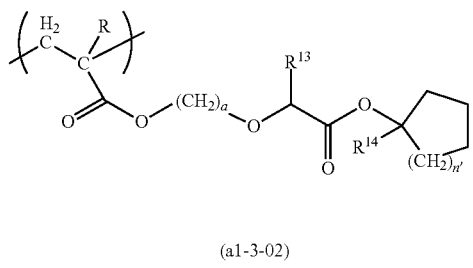

(a1-3-02)

wherein R represents a hydrogen atom, a lower alkyl group or a halogenated lower alkyl group; $R^{14}$ represents a lower alkyl group; $R^{13}$ represents a hydrogen atom or a methyl group; a represents an integer of 1 to 10; and n' represents an integer of 0 to 3.

\* \* \* \* \*

UNITED STATES PATENT AND TRADEMARK OFFICE
CERTIFICATE OF CORRECTION

PATENT NO. : 8,029,972 B2
APPLICATION NO. : 12/247807
DATED : October 4, 2011
INVENTOR(S) : Tsuyoshi Nakamura and Hiroaki Shimizu It is certified that error appears in the above-identified patent and that said Letters Patent is hereby corrected as shown below:

At Column 2, Line 11, After "241385" insert --.--.

At Column 4, Line 64, Change "slate" to --state--.

At Column 8, Line 32, Change "R1' and R2'" to --$R^{1\prime}$ and $R^{2\prime}$--.

At Column 9, Lines 37-38, Change "preferably" to --(preferably--.

At Column 10, Line 53, Change "ademantane," to --adamantane,--.

At Column 12, Line 2, Change "chin-like" to --chain-like--.

At Column 12, Line 59, Change "ate" to --are--.

At Column 12, Line 59, Change "s the" to --as the--.

At Column 31, Lines 3-16, Change " 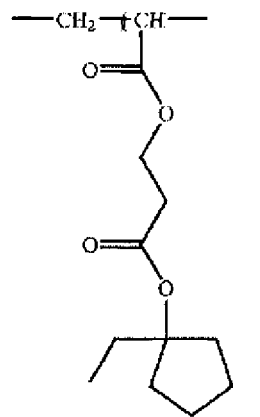 "

Signed and Sealed this
Twenty-seventh Day of March, 2012

David J. Kappos
*Director of the United States Patent and Trademark Office* to -- 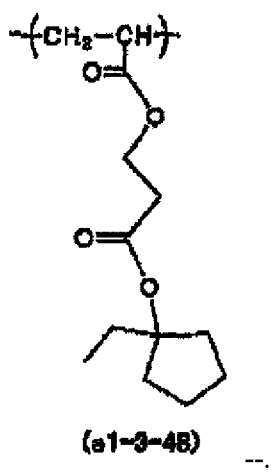 --.
At Column 39, Lines 3-23, Change " 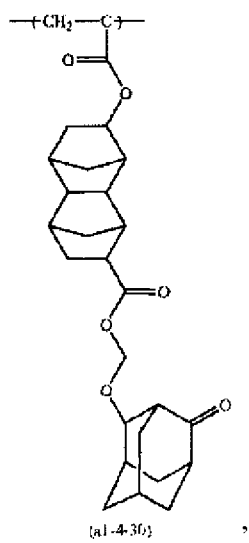 "
to -- 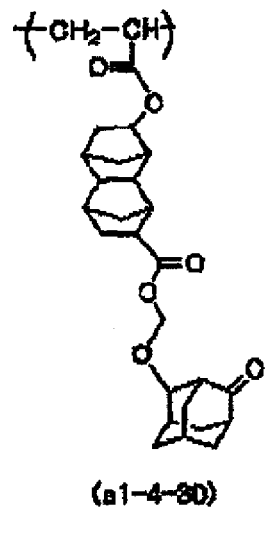 --.
At Column 40, Line 63, Change "(a1-3 02)," to --(a1-3-02),--.

CERTIFICATE OF CORRECTION (continued)
U.S. Pat. No. 8,029,972 B2

At Column 41, Line 29, Change "(hereafter" to --(hereafter,--.

At column 41, Line 38, Change "solvent" to --solvent,--.

At Column 51, Line 21, Change "polycyclic" to --(polycyclic--.

At Column 52, Line 24, Change "1" to --1,--.

At Column 52, Line 30, Change "norbonyl" to --norbornyl--.

At Column 52, Line 34, Change "2-norbonyl" to --2-norbornyl--.

At Column 52, Line 35, Change "3-norbonyl" to --3-norbornyl--.

At Column 52, Line 38, Change "norbonyl" to --norbornyl--.

At Column 53, Line 13, Change "sutures" to --structures--.

At Column 58, Line 28, Change "substituents," to --substituents.--.

At Column 60, Line 1, Change "$R^{5''}$," to --$R^{5''}$--.

At Column 60, Line 6, Change "exemplified," to --exemplified.--.

At Column 60, Line 47, Change "1-(4methoxynaphthalene" to --1-(4-methoxynaphthalene--.

At Column 61, Line 57, Change "allyl" to --alkyl--.

At Column 65, Line 17, Change "2," to --2.--.

At Column 66, Line 29, Change "dimethylethylsulfonyl)" to --dimethylphenylsulfonyl)--.

At Column 66, Line 41, Change "1,10bis" to --1,10-bis--.

At Column 67, Line 25, Change "weight" to --limit--.

At Column 67, Line 50, Change "atom" to --atom,--.

At Column 68, Line 60, Change "tetracycloalkene" to --tetracycloalkane--.

At Column 69, Line 18, Change "group," to --group.--.

At Column 69, Line 51, Change "mat be" to --may be--.

At Column 69, Line 58, Change "group-coining" to --group-containing--.

At Column 70, Line 48, Change "$R^1$" to --$R^5$--.

At Column 70, Line 61, Change "(D1))" to --(D1)--.

At Column 72, Line 22, Change "[5,4,0]-7" to --[5.4.0]-7--.

CERTIFICATE OF CORRECTION (continued)
U.S. Pat. No. 8,029,972 B2

At Column 72, Lines 23-24, Change "[2.2,2]octane." to --[2.2.2]octane.--.

At Column 75, Line 20, Change "tens" to --lens--.

At Column 75, Line 35, Change "as long at" to --as long as--.

At Column 76, Line 52, Change "thee-necked" to --three-necked--.

At Column 78, Line 14, Change "$CDCl_2$," to --$CDCl_3$,--.

At Column 79, Line 1, Change "results" to --result,--.

At Column 82, Line 12, Change "terns" to --terms--.

At Column 83, Lines 39-40, Change "tetranethylammonium" to --tetramethylammonium--.

At Column 85, Line 29, After "thereof)" insert --.--.

At Column 85, Line 38, After "Table 6" insert --.--.

At Column 86, Lines 31-32, Change "confined" to --confirmed--.